United States Patent
Takahashi

(10) Patent No.: US 7,285,369 B2
(45) Date of Patent: Oct. 23, 2007

(54) POSITIVE RESIST COMPOSITION AND PATTERN FORMATION METHOD USING THE SAME

(75) Inventor: Hyou Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/942,852

(22) Filed: Sep. 17, 2004

(65) Prior Publication Data

US 2005/0064329 A1 Mar. 24, 2005

(30) Foreign Application Priority Data

Sep. 19, 2003 (JP) .......................... P.2003-327311

(51) Int. Cl.
G03C 1/73 (2006.01)
G03F 7/039 (2006.01)
G03F 7/20 (2006.01)
G03F 7/30 (2006.01)

(52) U.S. Cl. .................. 430/270.1; 430/326; 430/905; 430/921; 430/925

(58) Field of Classification Search ............ 430/270.1, 430/921, 925, 326
See application file for complete search history.

(56) References Cited

U.S. PATENT DOCUMENTS

| 6,521,393 B1 | 2/2003 | Kishimura et al. |
| 6,811,961 B2 * | 11/2004 | Cameron et al. ............ 430/325 |
| 2003/0108809 A1 * | 6/2003 | Sato ........................... 430/171 |

FOREIGN PATENT DOCUMENTS

| JP | 2000-258902 A | 9/2000 |
| WO | WO 02/19033 A | 3/2002 |
| WO | WO 02/39186 A2 | 5/2002 |

OTHER PUBLICATIONS

G. Pohlers et al., "Transparency vs. efficiency in 193 nm photoacid generator design" Proceedings of the SPIE—The International Society for Optical Engineering, vol. 4690, No. 1, Mar. 2002, pp. 179-190, XP002315331 USA (p. 182).
European Search Report dated Feb. 24, 2005.

* cited by examiner

*Primary Examiner*—Sin Lee
(74) *Attorney, Agent, or Firm*—Sughrue Mion Pllc.

(57) ABSTRACT

A positive resist composition comprising (A) a resin that increases solubility in an alkali developing solution by the action of an acid and (B-1) a compound having a structure represented by formula (I) defined in the specification.

7 Claims, No Drawings

POSITIVE RESIST COMPOSITION AND PATTERN FORMATION METHOD USING THE SAME

FIELD OF THE INVENTION

The present invention relates to a positive resist composition used in the production process of semiconductor, for example, IC, in the production of circuit substrate for liquid crystal or thermal head, and in other photofabrication processes, and a pattern formation method using the positive resist composition.

BACKGROUND OF THE INVENTION

A resist composition is a patter formation material in which an acid is generated in the exposed area upon irradiation of radiation, for example, a far ultraviolet ray, and solubility in a developing solution between the exposed area with the radiation and the unexposed area is differentiated by a reaction using the acid as a catalyst, whereby a pattern is formed on a substrate.

With respect to the resist composition, for instance, an acid-generator having a specific structure in which a sulfur atom (cation) is substituted with a fluorine-substituted alkyl group is described in Patent Document 1 (WO 02/39186).

Also, an acid-generator containing, for example, a halogen atom, a trifluoromethyl group or the like in both a cation and an anion is described in Patent Document (JP-A-2000-258902 (the term "JP-A" as used herein means an "unexamined published Japanese patent application")).

However, it has been desired for hitherto known resist compositions to further improve line edge roughness. The term "line edge roughness" used herein means a phenomenon wherein edges of top and bottom of a line pattern of resist irregularly fluctuate in the direction vertical to the line due to the characteristics of resist and the edges are seen uneven, when the pattern is observed from just above.

Patent Document 1: WO 02/39186
Patent Document 2: JP-A-2000-258902

SUMMARY OF THE INVENTION

An object of the present invention is to provide a positive resist composition improved in the line edge roughness, and a pattern formation method using the positive resist composition.

Another object of the invention is to provide a positive resist composition, which exhibits high sensitivity, high resolution and rectangular profile and is excellent in PED stability, and a pattern formation method using the positive resist composition.

Other objects of the invention will become apparent from the following description.

The above-described objects of the invention are accomplished by the following constructions.

(1) A positive resist composition comprising (A) a resin that increases solubility in an alkali developing solution by the action of an acid and (B-1) a compound represented by the following formula (I):

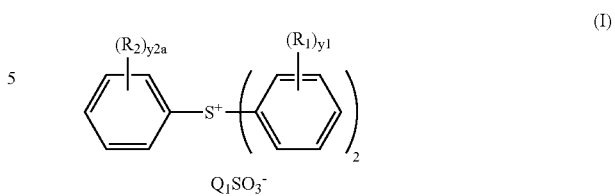

In formula (I), $R_1$ represents an alkyl group, an alicyclic hydrocarbon group, a hydroxy group, a carboxy group, an alkoxy group, a halogen atom or an phenylthio group, which may be the same or different, when two or more $R_1$'s are present; $R_2$ represents an alkyl group, an alicyclic hydrocarbon group, a hydroxy group, a carboxy group, an alkoxy group, a halogen atom or an phenylthio group, which may be the same or different, when two or more $R_2$'s are present, provided that at least one of $R_2$ represents a fluorine atom, an alkyl group substituted with a fluorine atom, an alicyclic hydrocarbon group substituted with a fluorine atom, an alkoxy group substituted with a fluorine atom or a phenylthio group substituted with a fluorine atom; $y_1$ each independently represents an integer of from 0 to 5; $y_{2a}$ represents an integer of from 1 to 5, provided that the total number of fluorine atoms included in $(R_2)y_{2a}$ is 4 or more; and $Q_1$ represents an alkyl group substituted with a fluorine atom, a cycloalkyl group substituted with a fluorine atom, an aryl group substituted with a fluorine atom or an aryl group substituted with a fluorinated alkyl group.

(2) The positive resist composition as described in (1), which further comprises a compound represented by the following formula (II) or (III):

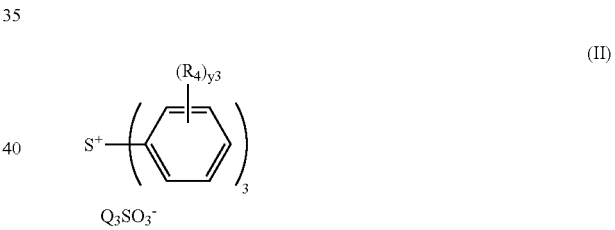

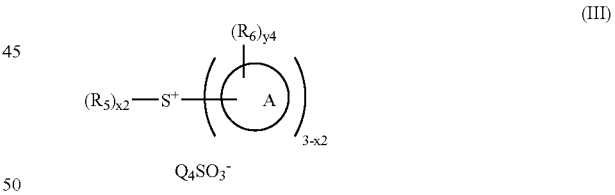

In formulae (II) and (III), $R_4$ represents an alkyl group, an alicyclic hydrocarbon group, a hydroxy group, a carboxy group or an alkoxy group, which may be the same or different, when two or more $R_4$'s are present; $R_5$ represents an alkyl group, an alicyclic hydrocarbon group, which may be the same or different, when two or more $R_5$'s are present, or when two or more $R_5$'s are present, two of $R_5$'s may be combined with each other to form a ring; $R_6$ represents an alkyl group, an alicyclic hydrocarbon group, a hydroxy group, a carboxy group or an alkoxy group, which may be the same or different, when two or more $R_6$'s are present; A represents an aromatic group; $x_2$ represents an integer of from 1 to 3; $y_3$ each independently represents an integer of from 0 to 5; $y_4$ each independently represents an integer of from 0 to 5; and $Q_3$ and $Q_4$ each represents an alkyl group substituted with a fluorine atom, a cycloalkyl group substituted with a fluorine atom, an aryl group substituted with a fluorine atom or an aryl group substituted with a fluorinated alkyl group.

(3) The positive resist composition as described in (1) or (2), which further comprises (D) a nitrogen-containing basic compound.

(4) A pattern formation method comprising the steps of forming a resist film using the positive resist composition as described in any one of (1) to (3), exposing the resist film, and developing the exposed resist film.

The present invention also includes the following preferred embodiments.

(5) The positive resist composition as described in any one of (1) to (3), wherein the resin of component (A) includes a monocyclic or polycyclic alicyclic hydrocarbon structure.

(6) The positive resist composition as described in (5), wherein the resin of component (A) is a resin containing an alkali-soluble group protected with a 2-alkyl-2-adamantyl group or a 1-adamantyl-1-alkylalkyl group.

(7) The positive resist composition as described in (5) or (6), wherein at least one of the alicyclic hydrocarbon structures in the resin of component (A) is dihydroxyadamantane.

DETAILED DESCRIPTION OF THE INVENTION

According to the present invention, a positive resist composition, which exhibits favorable line edge roughness, high sensitivity, high resolution and rectangular profile and is excellent in PED stability, and a pattern formation method using the positive resist composition can be provided.

The present invention will be described in greater detail below.

With respect to the description of a group (atomic group) in the specification, the term "group", which is not referred to whether it is substituted or not, means and includes both an unsubstituted group and a substituted group. For instance, the description of an "alkyl group" includes not only an alkyl group having no substituent (unsubstituted alkyl group) but also an alkyl group having a substituent (substituted alkyl group).

[1] Resin (A) that Increases Solubility in an Alkali Developing Solution by the Action of an Acid:

The positive resist composition of the invention includes a resin that increases solubility in an alkali developing solution by the action of an acid.

In the case of irradiating the positive resist composition of the invention with an ArF excimer laser, the resin that increases solubility in an alkali developing solution by the action of an acid is preferably a resin which has a monocyclic or polycyclic alicyclic hydrocarbon structure and which increases solubility in an alkali developing solution by the action of an acid (hereinafter also referred to as an "acid-decomposable resin of alicyclic hydrocarbon type").

As the acid-decomposable resin of alicyclic hydrocarbon type, for example, a resin which includes a repeating unit having a partial structure containing an alicyclic hydrocarbon represented by any one of formulae (pI) to (pVI) shown below and which increases solubility in an alkali developing solution by the action of an acid is preferred.

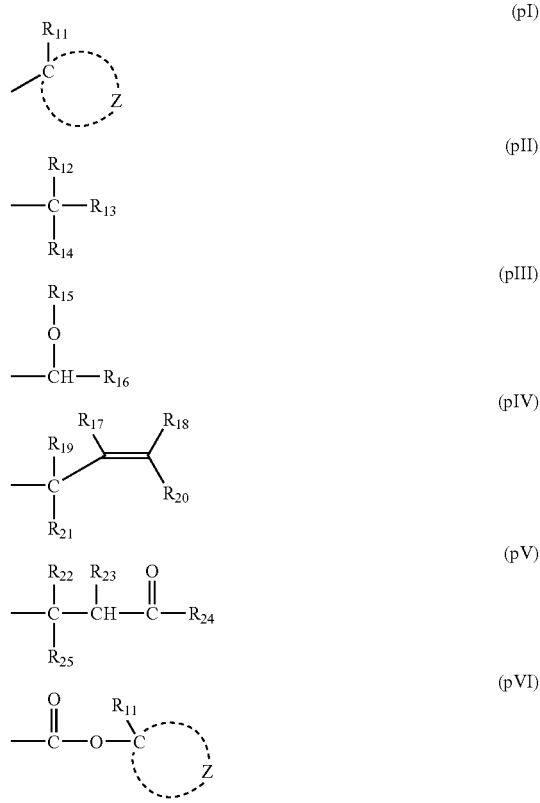

In the above formulae, $R_{11}$ represents a methyl group, an ethyl group, a n-propyl group, an isopropyl group, a n-butyl group, an isobutyl group or a sec-butyl group, and Z represents an atomic group necessary for forming an alicyclic hydrocarbon group together with the carbon atom.

$R_{12}$ to $R_{16}$ each independently represents a straight chain or branched alkyl group having from 1 to 4 carbon atoms or an alicyclic hydrocarbon group, provided that at least one of $R_{12}$ to $R_{14}$ or either $R_{15}$ or $R_{16}$ represents an alicyclic hydrocarbon group.

$R_{17}$ to $R_{21}$ each independently represents a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group and that either $R_{19}$ or $R_{21}$ represents a straight chain or branched alkyl group having from 1 to 4 carbon atoms or an alicyclic hydrocarbon group.

$R_{22}$ to $R_{25}$ each independently represents a hydrogen atom, a straight chain or branched alkyl group having from 1 to 4 carbon atoms or an alicyclic hydrocarbon group, provided that at least one of $R_{22}$ to $R_{25}$ represents an alicyclic hydrocarbon group. Alternatively, $R_{23}$ and $R_{24}$ may be combined with each other to form a ring.

In formulae (pI) to (pVI), the alkyl group represented by any one of $R_{12}$ to $R_{25}$ represents a straight chain or branched alkyl group having from 1 to 4 carbon atoms. Examples of the alkyl group include a methyl group, an ethyl group, a n-propyl group, an isopropyl group, a n-butyl group, an isobutyl group, a sec-butyl group and a tert-butyl group.

Examples of the substituent for the alkyl group include an alkoxy group having from 1 to 4 carbon atoms, a halogen atom (e.g., a fluorine atom, a chlorine atom, a bromine atom or an iodine atom), an acyl group, an acyloxy group, a cyano group, a hydroxy group, a carboxy group, an alkoxycarbonyl group and a nitro group.

The alicyclic hydrocarbon group represented by any one of $R_{11}$ to $R_{25}$ or the alicyclic hydrocarbon group formed by both Z and the carbon atom may be monocyclic or polycyclic. Specific examples thereof include groups containing a monocyclic, bicyclic, tricyclic or tetracyclic structure having 5 or more carbon atoms. The number of carbon atoms included therein is preferably from 6 to 30, and particularly preferably from 6 to 25. The alicyclic hydrocarbon group may have a substituent.

Structural examples of the alicyclic moiety of the alicyclic hydrocarbon group are set forth below.

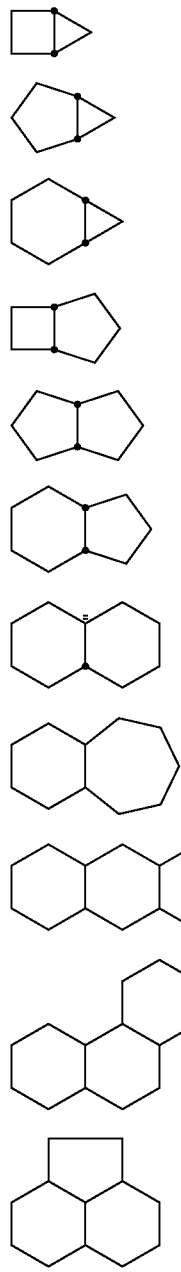

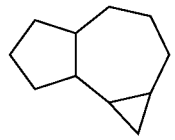

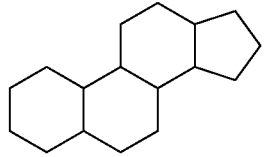

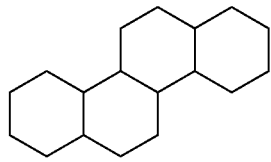

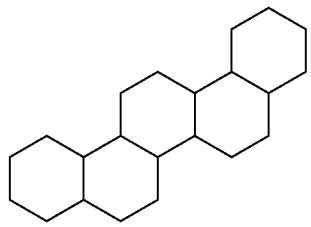

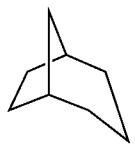 (24)
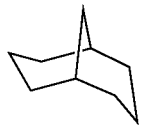 (25)
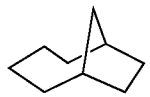 (26)
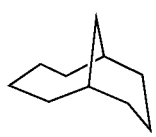 (27)
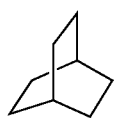 (28)
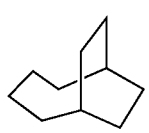 (29)
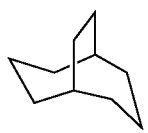 (30)
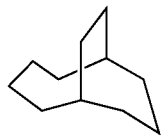 (31)
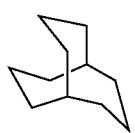 (32)
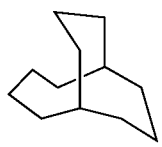 (33)
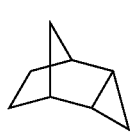 (34)
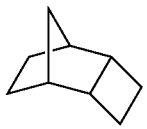 (35)
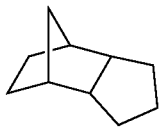 (36)
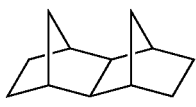 (37)
 (38)
 (39)
 (40)
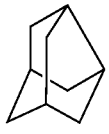 (41)
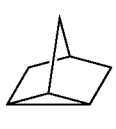 (42)
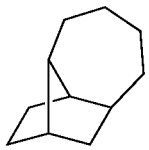 (43)
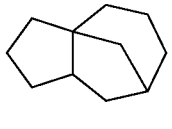 (44)
 (45)
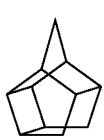 (46)
 (47)

-continued (48)

(49)

(50)

In the invention, preferred examples of the above-described alicyclic hydrocarbon moiety include an adamantly group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. More preferred examples thereof include an adamantly group, a decalin residue, a norbornyl group, a cedrol group, a cyclohexyl group, a cycloheptyl group, a cyclooctyl group, a cyclodecanyl group and a cyclododecanyl group.

Examples of the substituent for the alicyclic hydrocarbon group include an alkyl group, a halogen atom, a hydroxy group, an alkoxy group, a carboxy group and an alkoxycarbonyl group. As the alkyl group, a lower alkyl group, for example, a methyl group, an ethyl group, a propyl group, an isopropyl group or a butyl group is preferred. More preferred alkyl group includes a methyl group, an ethyl group, a propyl group and an isopropyl group. As the alkoxy group, an alkoxy group having from 1 to 4 carbon atoms, for example, a methoxy group, an ethoxy group, a propoxy group or a butoxy group is exemplified. The alkyl group or alkoxy group may further have a substituent. Examples of the substituent for the alkyl group or alkoxy group include a hydroxy group, a halogen atom and an alkoxy group.

The structure represented by any one of formulae (pI) to (pVI) in the above resin can be used for protection of an alkali-soluble group. Examples of the alkali-soluble group include various alkali-soluble groups known in the field of art.

Specific examples thereof include a carboxylic acid group, a sulfonic acid group, a phenol group and a thiol group, and a carboxylic acid group and a sulfonic acid group are preferred.

Preferred examples of the alkali-soluble group protected with the structure represented by any one of formulae (pI) to (PVI) in the above resin include groups represented by the following formulae (pVII) to (pXI).

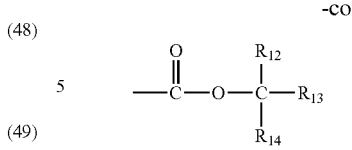
(pVII)

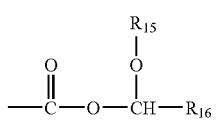
(pVIII)

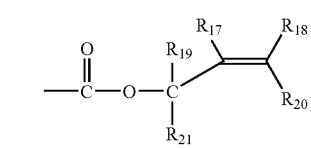
(pIX)

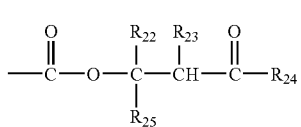
(pX)

(pXI)

In the above formulae, $R_{11}$ to $R_{25}$ and Z have the same meanings as those defined hereinbefore, respectively.

In the above resin, preferred examples of repeating unit including the alkali-soluble group protected with the structure represented by any one of formulae (pI) to (pVI) include a repeating unit represented by the following formula (pA).

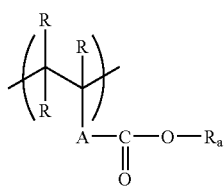
(pA)

In the above formula, R represents a hydrogen atom, a halogen atom or a straight chain or branched alkyl group having from 1 to 4 carbon atoms. A plurality of R's may be the same or different from each other. The alkyl group for R may have a substituent, for example, an alkoxy group (preferably having 3 carbon atoms or less).

A represents an individual group or a combination of two or more groups selected from a single bond, an alkylene group, an ether group, a thioether group, a carbonyl group, an ester group, an amido group, a sulfonamido group, a urethane group and a urea group. The alkylene group for A may have a substituent (preferably having 5 carbon atoms or less), for example, an alkyl group or an alkoxy group.

Ra represents any one of the groups represented by formulae (pI) to (pVI).

Ra is preferably a 2-alkyl-2-adamantyl group or a 1-adamantyl-1-alkylalkyl group. The alkyl group in these groups has preferably from 1 to 8 carbon atoms, and more preferably from 1 to 3 carbon atoms.

Specific examples of the monomer corresponding to the repeating unit represented by formula (pA) are set forth below.

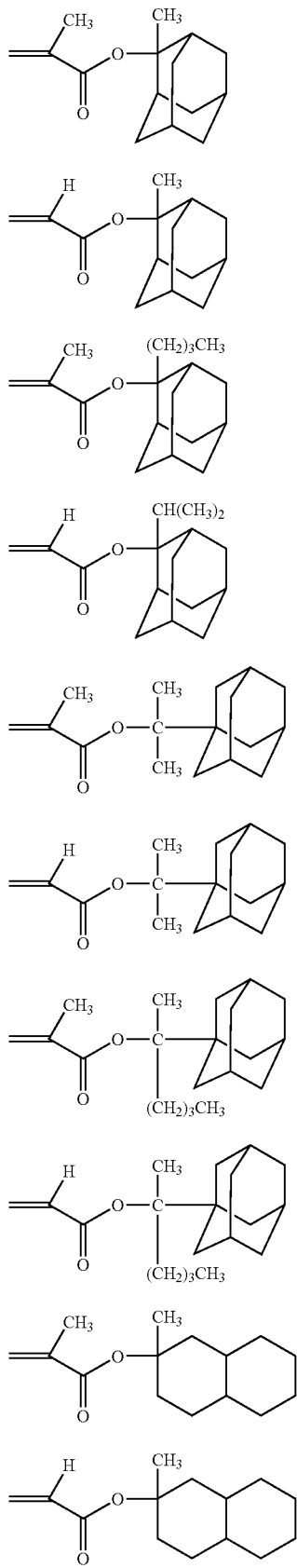
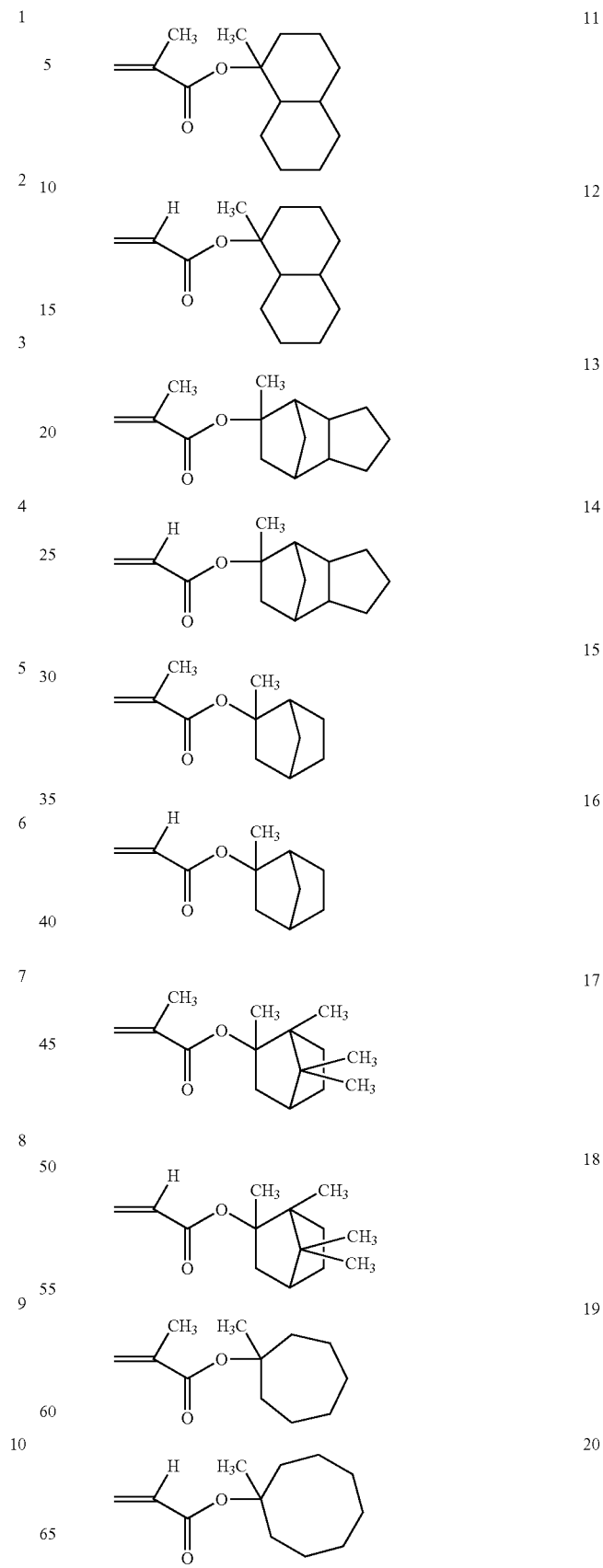

-continued

21 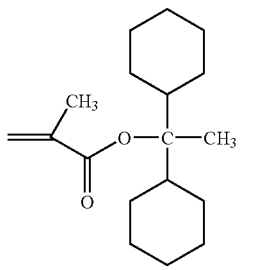

22 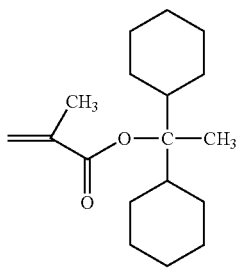

23 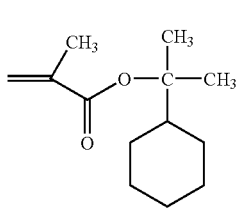

24 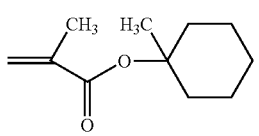

25 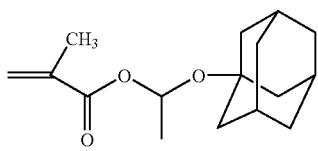

26 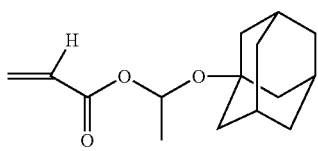

27 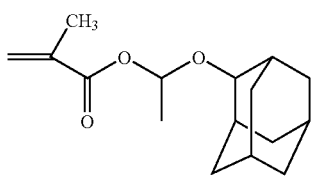

28

-continued

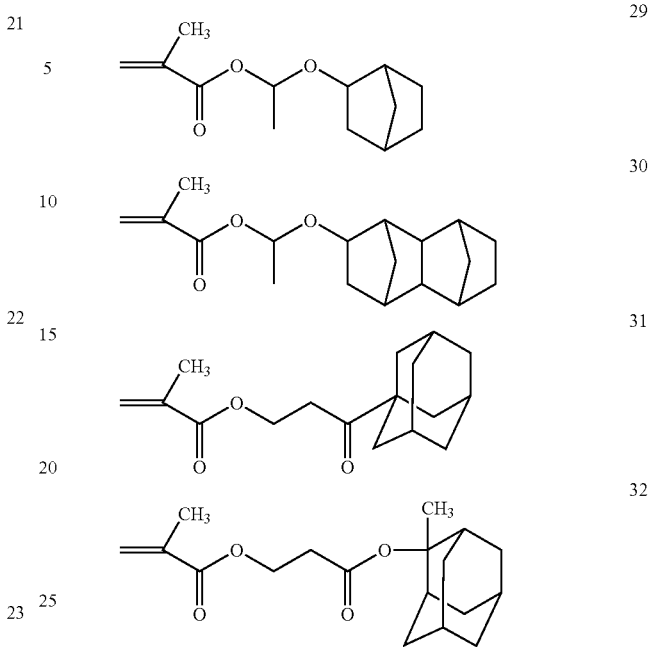

It is preferred that the acid-decomposable resin of alicyclic hydrocarbon type includes a repeating unit having an alkali-soluble group protected with a 2-alkyl-2-adamantyl group, for example, a repeating unit formed from any one of the above-described monomers 1 to 4 and 32.

It is preferred that the acid-decomposable resin of alicyclic hydrocarbon type includes a repeating unit having an alkali-soluble group protected with a 1-adamantyl-1-alkylalkyl group, for example, a repeating unit formed from any one of the above-described monomers 5 to 8.

The resin in accordance with the invention includes a group which is insoluble or slightly soluble in alkali and capable of being decomposed by the action of an acid to become alkali-soluble (hereinafter also referred to as an "acid-decomposable group").

The acid-decomposable group can be incorporated into at least one repeating unit selected from the repeating units having the partial structure containing the alicyclic hydrocarbon represented by any one of formulae (pI) to (pVI) and repeating units of copolymerization components described hereinafter.

The structure of the acid-decomposable group includes a group represented by the following formula:

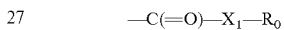
—C(=O)—X$_1$—R$_0$

In the formula, R$_0$ represents, for example, a tertiary alkyl group, for example, a tert-butyl group or a tert-amyl group, an isobornyl group, a 1-alkoxyethyl group, for example, 1-ethoxyethyl, 1-butyoxyethyl, 1-isobutoxyethyl or 1-cyclohexyloxyethyl, an alkoxymethyl group, for example, 1-methoxymethyl or 1-ethoxymethyl, a 3-oxoalkyl group, a tetrahydropyranyl group, a tetrahydrofuranyl group, a trialkylsilyl ester group, a 3-oxocyclohexyl ester group, a 2-methyl-2-adamantyl group and a mevalonic lactone residue. X$_1$ represents an oxygen atom, a sulfur atom, —NH—, —NHSO$_2$— or —NHSO$_2$NH—.

It is preferred that the acid-decomposable resin of alicyclic hydrocarbon type further includes a repeating unit represented by the following formula (H).

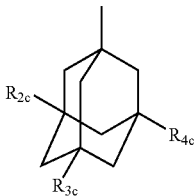

In formula (H), $R_{2c}$ to $R_{4c}$ each independently represents a hydrogen atom or a hydroxy group, provided that at least one of $R_{2c}$ to $R_{4c}$ represents a hydroxy group.

The group represented by formula (H) is preferably a dihydroxy-substituted group or a monohydroxy-substituted group, and more preferably a dihydroxy-substituted group.

Examples of the repeating unit having the group represented by formula (H) include a repeating unit represented by the following formula (HI):

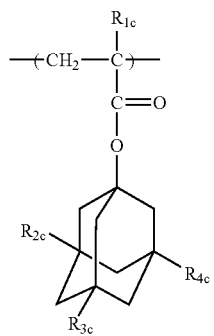

In formula (HI), $R_{1c}$ represents a hydrogen atom or a methyl group.

$R_{2c}$ to $R_{4c}$ each independently represents a hydrogen atom or a hydroxy group, provided that at least one of $R_{2c}$ to $R_{4c}$ represents a hydroxy group.

Specific examples of the repeating unit represented by formula (HI) are set forth below, but the invention should not be construed as being limited thereto.

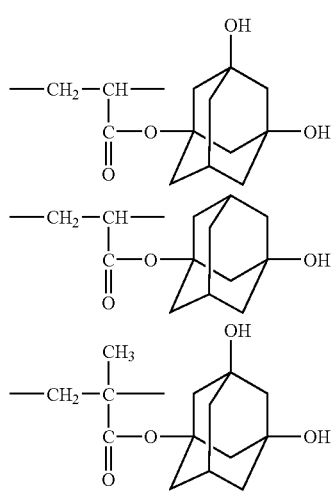

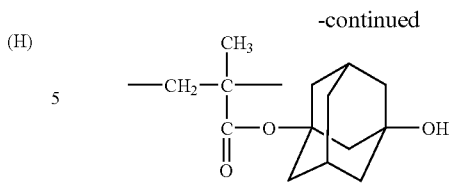

The acid-decomposable resin of alicyclic hydrocarbon type can further have a repeating unit having a lactone structure represented by the following formula (IV):

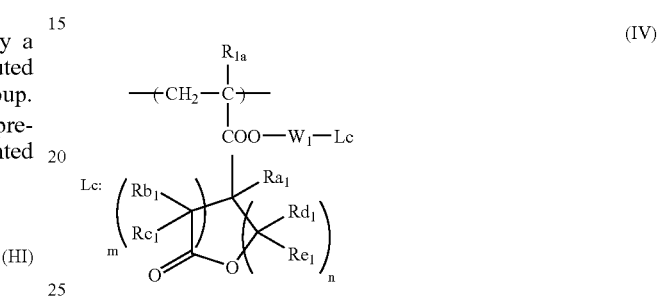

In formula (IV), $R_{1a}$ represents a hydrogen atom or a methyl group.

$W_1$ represents an individual group or a combination of two or more groups selected from a single bond, an alkylene group, an ether group, a thioether group, a carbonyl group and an ester group.

$Ra_1$, $Rb_1$, $Rc1$, $Rd_1$ and $Re_1$ each independently represents a hydrogen atom or an alkyl group having from 1 to 4 carbon atoms, and m and n each independently represents an integer of from 0 to 3, provided that m+n is from 2 to 6.

Examples of the alkyl group having from 1 to 4 carbon atoms represented by any one of $Ra_1$ to $Re_1$ include a methyl group, an ethyl group, a propyl group, an isopropyl group, a n-butyl group, an isobutyl group, a sec-butyl group and a tert-butyl group.

In formula (IV), examples of the alkylene group represented by $W_1$ include a group represented by the following formula:

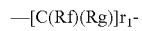

In the above formula, Rf and Rg, which may be the same or different, each represents a hydrogen atom, an alkyl group, a halogen atom, a hydroxy group or an alkoxy group. Preferred examples of the alkyl group include a lower alkyl group, for example, a methyl group, an ethyl group, a propyl group, an isopropyl group or a butyl group. More preferred examples thereof include a methyl group, an ethyl group, a propyl group and an isopropyl group. Examples of the alkoxy group include an alkoxy group have from 1 to 4 carbon atoms, for example, a methoxy group, an ethoxy group, a propoxy group or a butoxy group. The alkyl group or alkoxy group may have a substituent. Examples of the substituent for the alkyl group or alkoxy group include a hydroxy group, a halogen atom and an alkoxy group. Examples of the halogen atom include a chlorine atom, a bromine atom, a fluorine atom and an iodine atom. $r_1$ represents an integer of from 1 to 10.

Specific examples of the repeating unit represented by formula (IV) are set forth below, but the invention should not be construed as being limited thereto.

(IV-1) 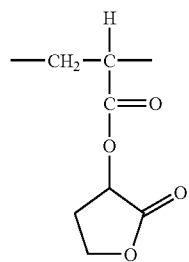
(IV-2) 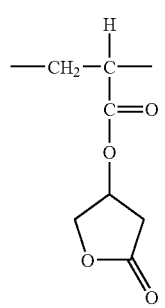
(IV-3) 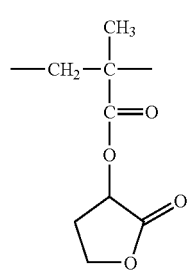
(IV-4) 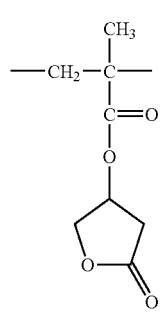
(IV-5) 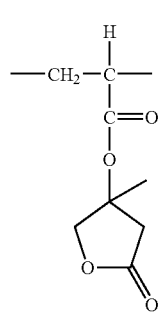
-continued
(IV-6) 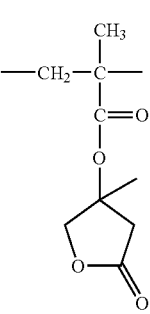
(IV-7) 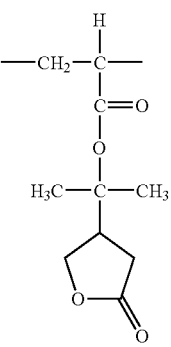
(IV-8) 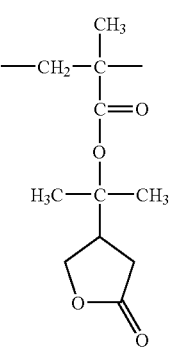
(IV-9) 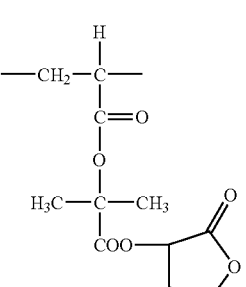
(IV-10) 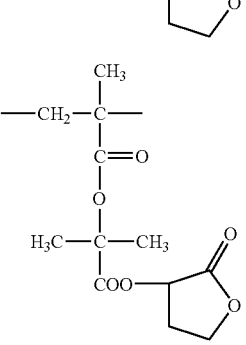

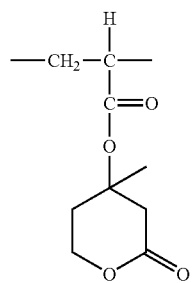 (IV-11)
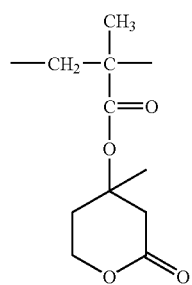 (IV-12)
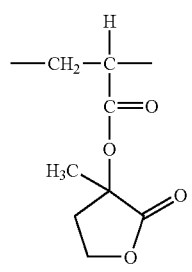 (IV-13)
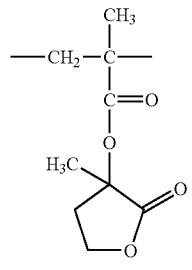 (IV-14)
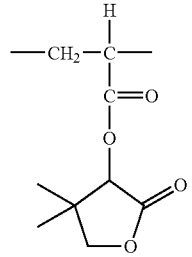 (IV-15)
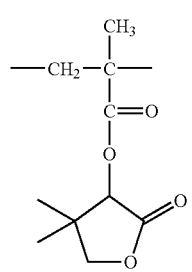 (IV-16)
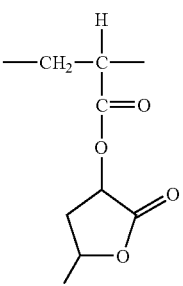 (IV-17)
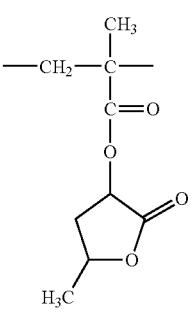 (IV-18)
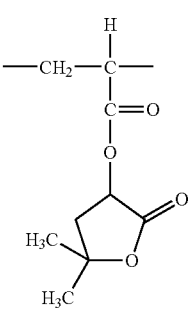 (IV-19)
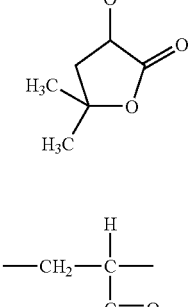 (IV-20)
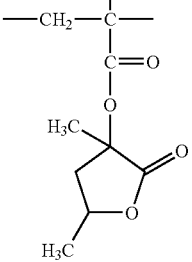 (IV-21)

(IV-22) 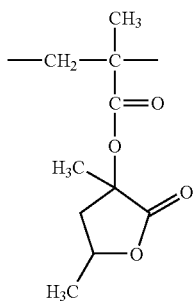
(IV-23) 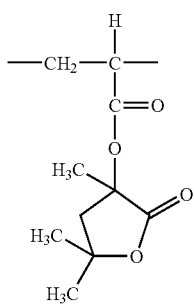
(IV-24) 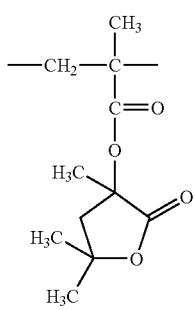
(IV-25) 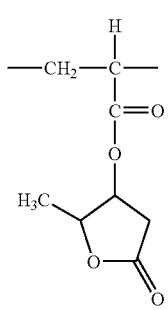
(IV-26) 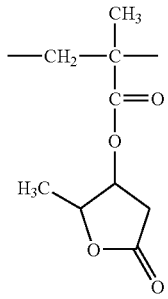
(IV-27) 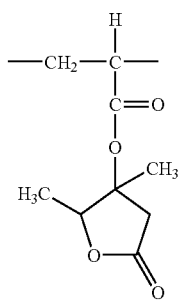
(IV-28) 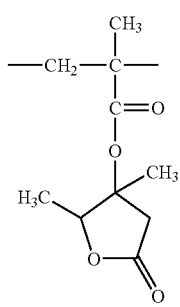
(IV-29) 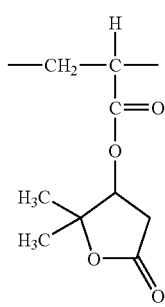
(IV-30) 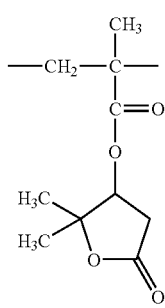
(IV-31) 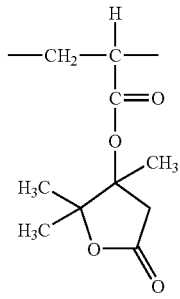

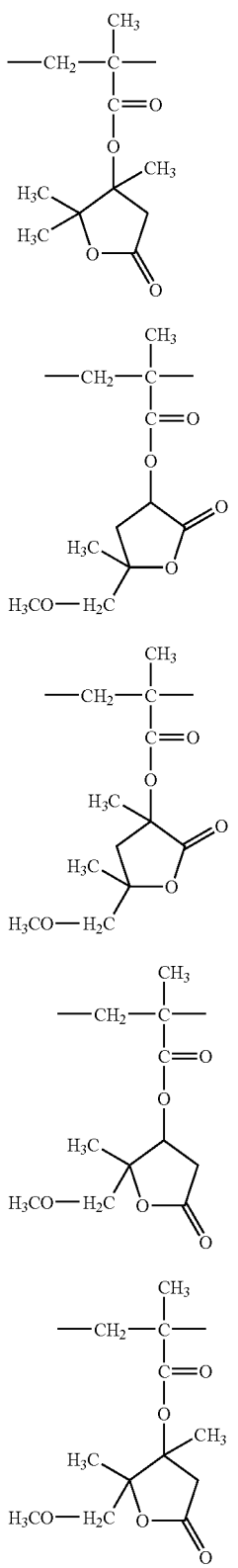

(IV-32)
(IV-33)
(IV-34)
(IV-35)
(IV-36)

Of the specific examples of the repeating unit represented by formula (IV), (IV-17) to (IV-36) are preferred from the standpoint of obtaining better exposure margin.

As to the structure of repeating unit represented by formula (IV), the repeating unit having an acrylate structure is preferred in view of obtaining good edge roughness.

The resin may also contain a repeating unit represented by any one of the following formulae (V-1) to (V-4).

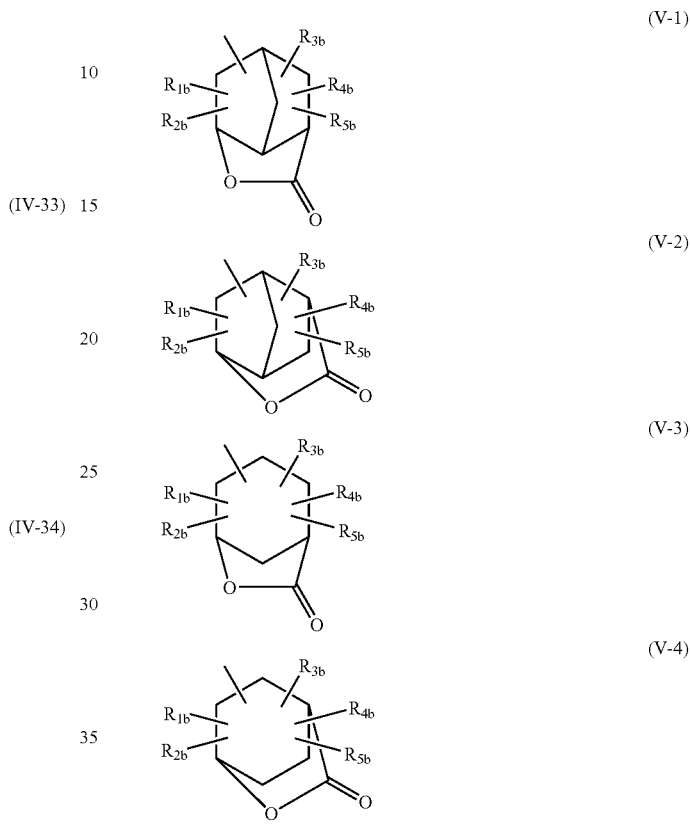

In formulae (V-1) to (V-4), $R_{1b}$ to $R_{5b}$ each independently represents a hydrogen atom, an alkyl group, a cycloalkyl group or an alkenyl group. Or, two of $R_{1b}$ to $R_{5b}$ may be combined with each other to form a ring.

The alkyl group represented by any one of $R_{1b}$ to $R_{5b}$ in formulae (V-1) to (V-4) includes a straight chain or branched alkyl group, which may have a substituent.

As the straight chain or branched alkyl group, a straight or branched alkyl group having from 1 to 12 carbon atoms is preferred, a straight or branched alkyl group having from 1 to 10 carbon atoms is more preferred, and a methyl group, an ethyl group, a propyl group, an isopropyl group, a n-butyl group, an isobutyl group, a sec-butyl group, a tert-butyl group, a pentyl group, a hexyl group, a heptyl group, an octyl group, a nonyl group and a decyl group are still more preferred.

The cycloalkyl group represented by any one of $R_{1b}$ to $R_{5b}$ preferably include a cycloalkyl group having from 3 to 8 carbon atoms, for example, a cyclopropyl group, a cyclopentyl group, a cyclohexyl group, a cycloheptyl group or a cyclooctyl group.

The alkenyl group represented by any one of $R_{1b}$ to $R_{5b}$ preferably include an alkenyl group having from 2 to 6 carbon atoms, for example, a vinyl group, a propenyl group, a butenyl group or a hexenyl group.

The ring formed by combining two of $R_{1b}$ to $R_{5b}$ with each other include 3- to 8-membered rings, for example, a cyclopropane ring, a cyclobutane ring, a cyclopentane ring, a cyclohexane ring or a cyclooctane ring.

$R_{1b}$ to $R_{5b}$ in formulae (V-1) to (V-4) may be connected to any carbon atom constituting the cyclic skeleton.

Preferred examples of the substituent for the alkyl group, cycloalkyl group or alkenyl group include an alkoxy group having from 1 to 4 carbon atoms, a halogen atom (e.g., a fluorine atom, a chlorine atom, a bromine atom or an iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of the repeating unit having the group represented by any one of formulae (V-1) to (V-4) include a repeating unit represented by the following formula (V):

In formula (V), $R_{b0}$ represents a hydrogen atom, a halogen atom or an alkyl group having from 1 to 4 carbon atoms. Preferred examples of the substituent for the alkyl group represented by $R_{b0}$ include those described for the preferred examples of the substituent for the alkyl group represented by $R_{1b}$ in formulae (V-1) to (V-4).

Examples of the halogen atom represented by $R_{b0}$ include a fluorine atom, a chlorine atom, a bromine atom and an iodine atom. $R_{b0}$ preferably represents a hydrogen atom.

A' represents a single bond, an ether group, an ester group, a carbonyl group, an alkylene group or a divalent group formed by a combination thereof.

$B_2$ represents a group represented by any one of formulae (V-1) to (V-4). In A', examples of the divalent group formed by the combination include those represented by the following formula:

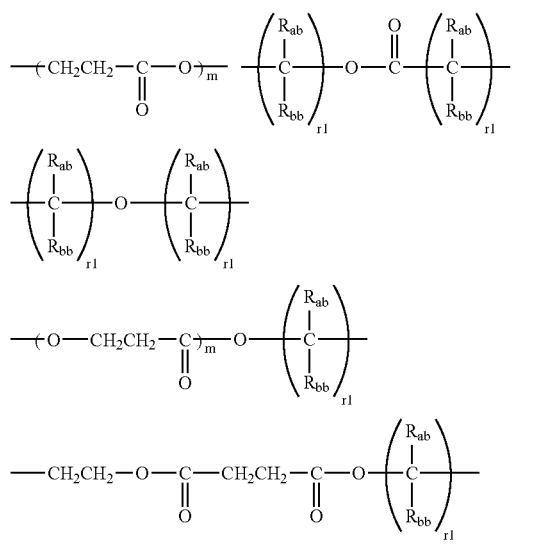

In the above formulae, $R_{ab}$ and $R_{bb}$, which may be the same or different, each represents a hydrogen atom, an alkyl group, a halogen atom, a hydroxy group or an alkoxy group.

The alkyl group preferably includes a lower alkyl group, for example, a methyl group, an ethyl group, a propyl group, an isopropyl group or a butyl group, and more preferably, a methyl group, an ethyl group, a propyl group, an isopropyl group. Examples of the alkoxy group include an alkoxy group having from 1 to 4 carbon atoms, for example, a methoxy group, an ethoxy group, a propoxy group and a butoxy group. The alkyl group or alkoxy group may have a substituent. Examples of the substituent for the alkyl group or alkoxy group include a hydroxy group, a halogen atom and an alkoxy group. Examples of the halogen atom include a chlorine atom, a bromine atom, a fluorine atom and an iodine atom. r1 represents an integer of from 1 to 10, preferably an integer of from 1 to 4. m represents an integer of from 1 to 3, preferably 1 or 2.

Specific examples of the repeating unit represented by formula (V) are set forth below, but the invention should not be construed as being limited thereto.

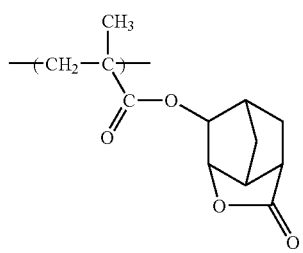

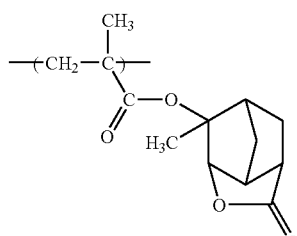

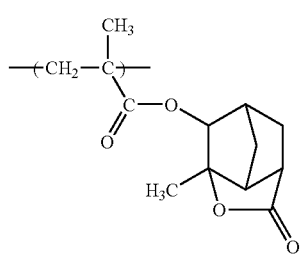

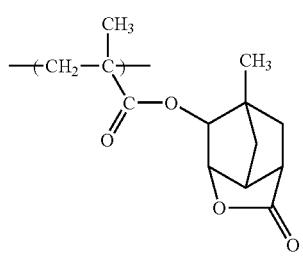

-continued
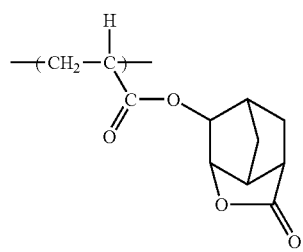
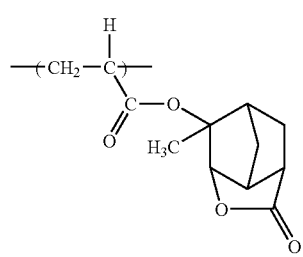
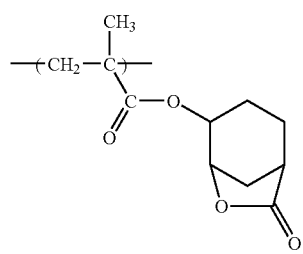
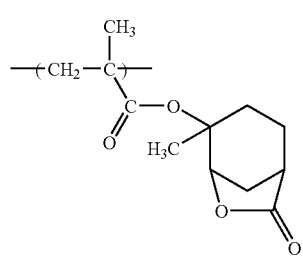
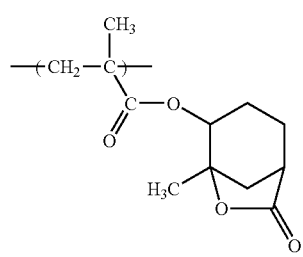
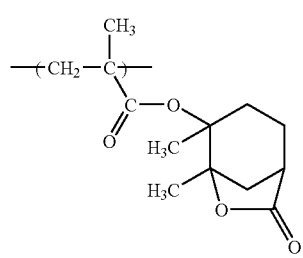
-continued
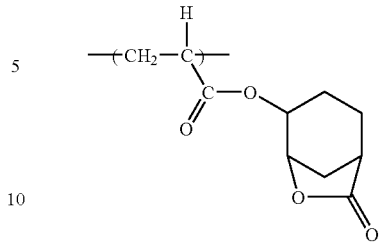
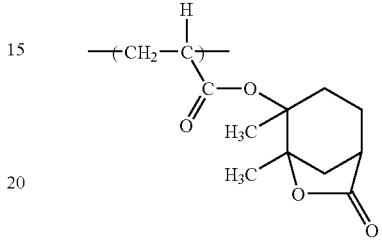
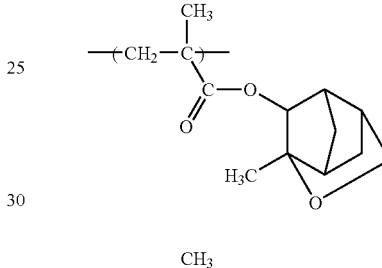
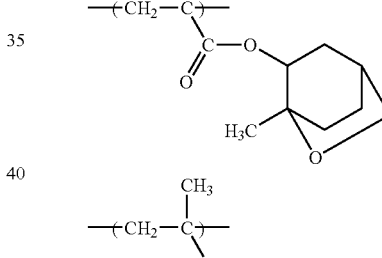
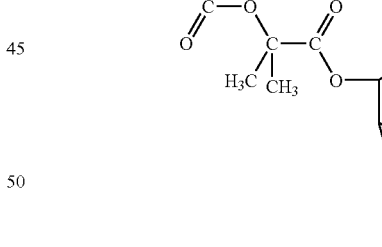
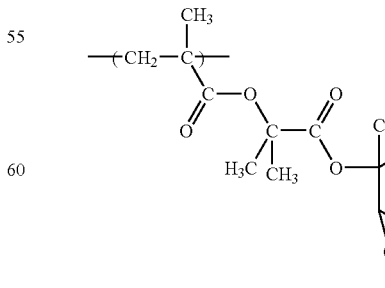

-continued
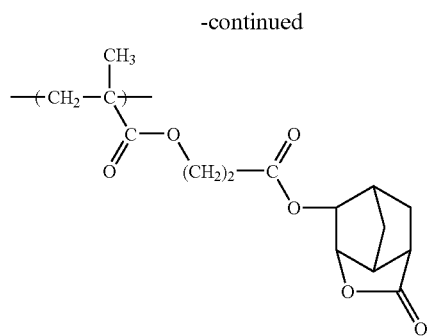
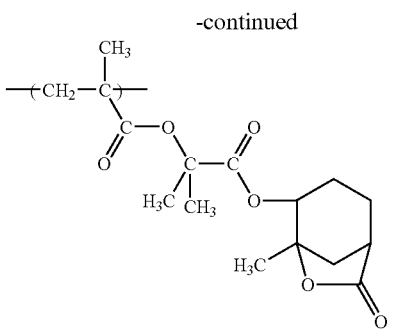
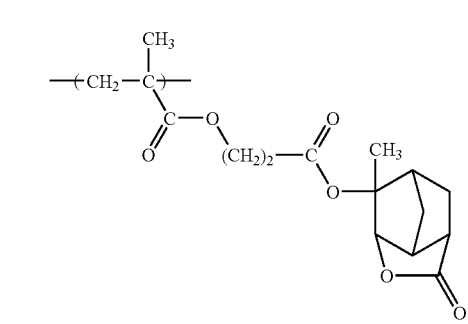
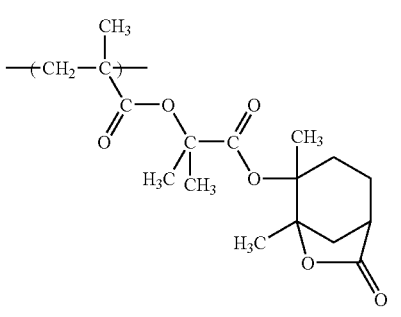
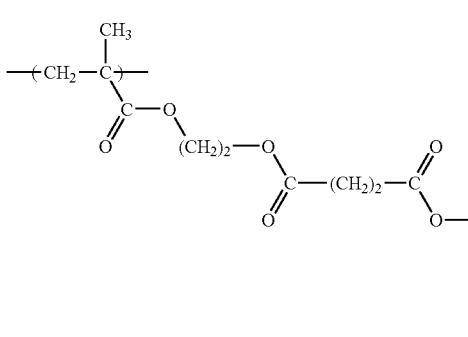
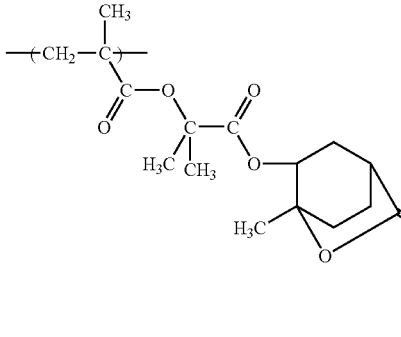
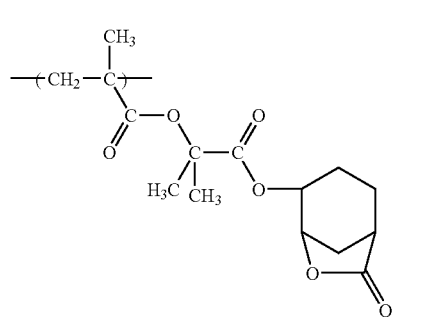
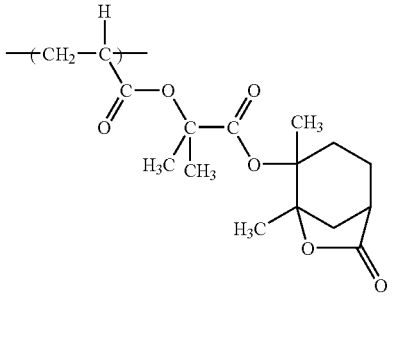
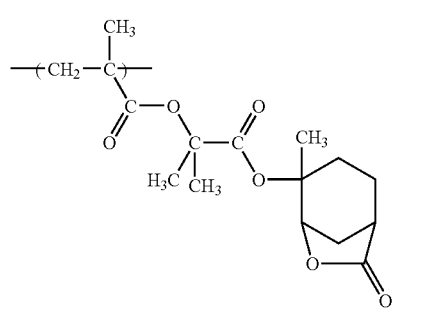
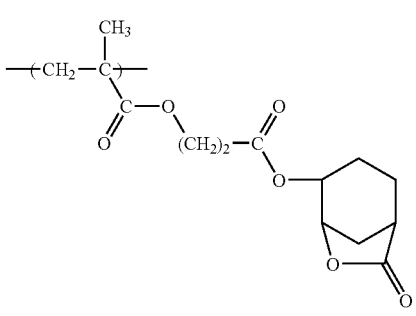

-continued

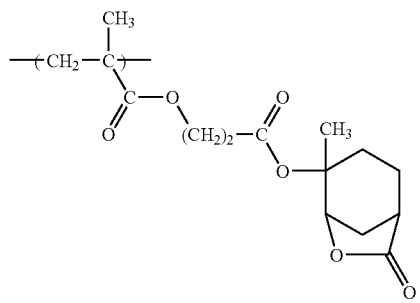

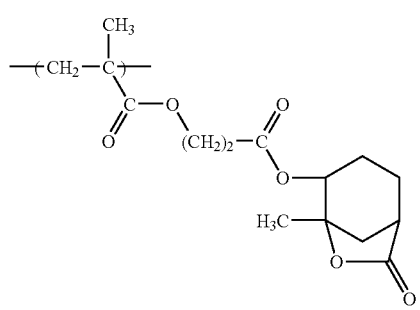

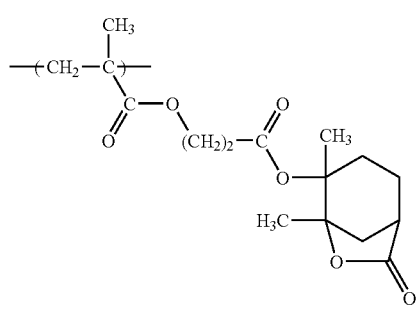

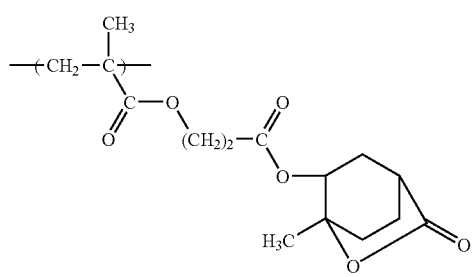

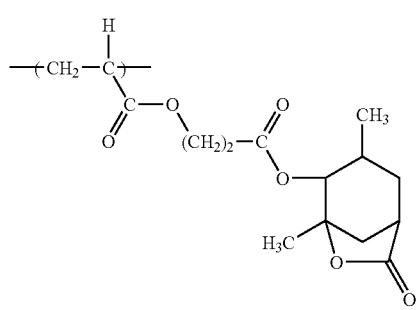

The acid-decomposable resin of alicyclic hydrocarbon type according to the invention may further have a repeating unit represented by the following formula (VI):

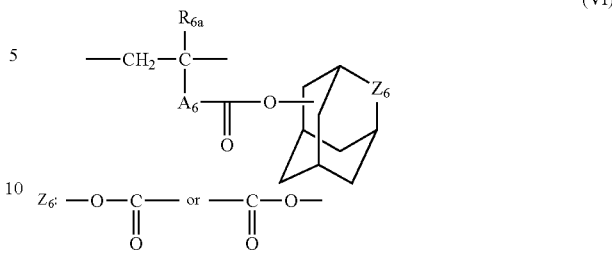

In formula (VI), $A_6$ represents an individual group or a combination of two or more groups selected from a single bond, an alkylene group, a cycloalkylene group, ah ether group, a thioether group, a carbonyl group and an ester group.

$R_{6a}$ represents a hydrogen atom, an alkyl group having from 1 to 4 carbon atoms, a cyano group or a halogen atom.

In the formula (VI), the alkylene group represented by $A_6$ include a group represented by the following formula:

—[C(Rnf)(Rng)]r-

In the above formula, Rnf and Rng, which may be the same or different, each represents a hydrogen atom, an alkyl group, a halogen atom, a hydroxy group or an alkoxy group. Preferred examples of the alkyl group include a lower alkyl group, for example, a methyl group, an ethyl group, a propyl group, an isopropyl group or a butyl group. More preferred examples thereof include a methyl group, an ethyl group, a propyl group and an isopropyl group, Examples of the alkoxy group include an alkoxy group having from 1 to 4 carbon atoms, for example, a methoxy group, an ethoxy group, a propoxy group or a butoxy group. The alkyl group or alkoxy group may have a substituent. Examples of the substituent for the alkyl group or alkoxy group include a hydroxy group, a halogen atom and an alkoxy group. Examples of the halogen atom include a chlorine atom, a bromine atom, a fluorine atom and an iodine atom. r represents an integer of from 1 to 10.

In formula (VI), examples of the cycloalkylene group represented by $A_6$ include a cycloalkylene group having from 3 to 10 carbon atoms, for example, a cyclopentylene group, a cyclohexylene group or acyclooctylene group.

The bridged alicyclic group including $Z_6$ may have a substituent. Examples of the substituent include a halogen atom, an alkoxy group (preferably having from 1 to 4 carbon atoms), an alkoxycarbonyl group (preferably having from 1 to 5 carbon atoms), an acyl group (e.g., a formyl group or a benzoyl group), an acyloxy group (e.g., a propylcarbonyloxy group or a benzoyloxy group), an alkyl group (preferably having from 1 to 4 carbon atoms), a carboxy group, a hydroxy group and an alkylsulfamoylcarbonyl group (e.g., —$CONHSO_2CH_3$). The alkyl group as the substituent may further be substituted, for example, with a hydroxy group, a halogen atom or an alkoxy group (preferably having from 1 to 4 carbon atoms).

In formula (VI), the oxygen atom of the ester group connected to $A_6$ may be connected to any carbon atom constituting the bridged alicyclic structure including $Z_6$.

Specific examples of the repeating unit represented by formula (VI) are set forth below, but the invention should not be construed as being limited thereto.

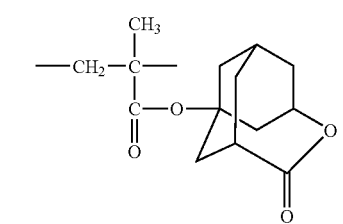
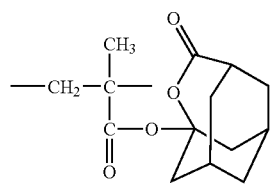
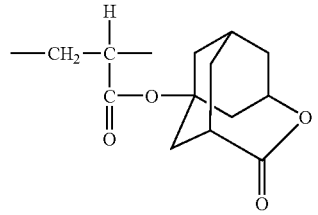
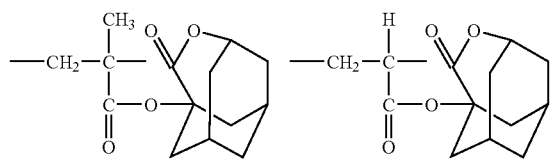
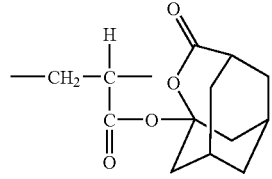
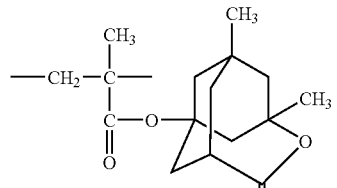
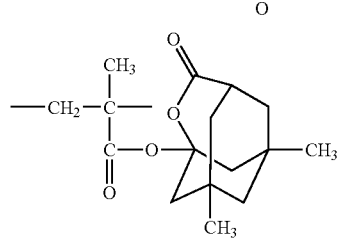
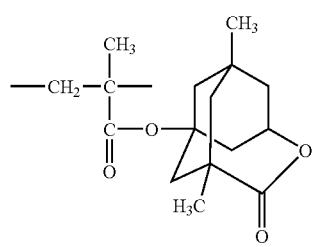
-continued
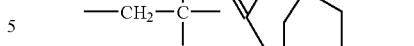
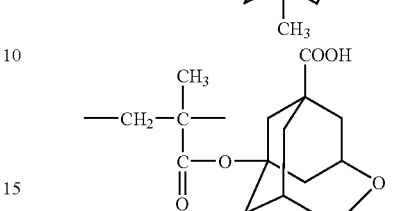
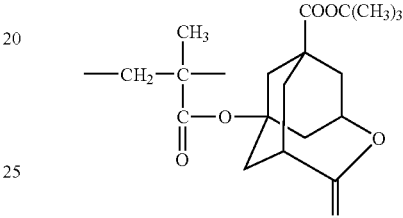
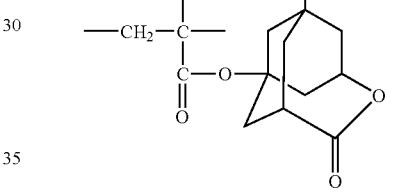
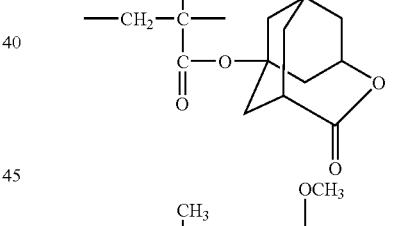
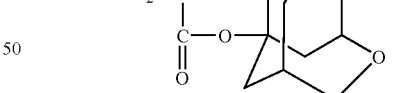
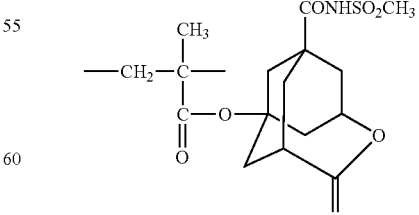
The acid-decomposable resin of alicyclic hydrocarbon type of component (A) may further include various repeating units in addition to the above repeating units for the purpose of adjusting dry etching resistance, standard developing solution aptitude, adhesion to a substrate, resist profile, and other characteristics ordinarily required for resist, for example, resolution, heat resistance and sensitivity.

Examples of such repeating units include repeating units corresponding to monomers described below, but the invention should not be construed as being limited thereto.

The introduction of additional repeating unit makes possible the minute control of characteristics required for the acid-decomposable resin, particularly, (1) solubility in a coating solvent, (2) film forming property (glass transition point), (3) developing property with alkali, (4) reduction in a film thickness (hydrophobicity, selection of alkali-soluble group), (5) adhesion of the unexposed area to a substrate, and (6) dry etching resistance.

Examples of such monomers include compounds having one addition-polymerizable unsaturated bond, for example, acrylates, methacrylates, acrylamides, methacrylamides, allyl compounds, vinyl ethers and vinyl esters.

Specific examples of the monomer include the following:

acrylates (preferably an alkyl acrylate containing an alkyl group having from 1 to 10 carbon atoms), for example, methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate;

methacrylates (preferably an alkyl methacrylate containing an alkyl group having from 1 to 10 carbon atoms), for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate;

acrylamides, for example, acrylamide, an N-alkylacrylamide (the alkyl group of which includes an alkyl group having from 1 to 10 carbon atoms, e.g., a methyl group, an ethyl group, a propyl group, a butyl group, a tert-butyl group, a heptyl group, an octyl group, a cyclohexyl group or a hydroxyethyl group), an N,N-dialkylacrylamide (the alkyl group of which includes an alkyl group having from 1 to 10 carbon atoms, e.g., a methyl group, an ethyl group, a butyl group, an isobutyl group, an ethylhexyl group or a cyclohexyl group), N-hydroxyethyl-N-methylacrylamide and N-2-acetamidoethyl-N-acetylacrylamide;

methacrylamides, for example, methacrylamide, an N-alkylmethacrylamide (the alkyl group of which includes an alkyl group having from 1 to 10 carbon atoms, e.g., a methyl group, an ethyl group, a tert-butyl group, an ethylhexyl group, a hydroxyethyl group or a cyclohexyl group), an N,N-dialkylmethacrylamide (the alkyl group of which includes, e.g., an ethyl group, a propyl group and a butyl group) and N-hydroxyethyl-N-methylmethacrylamide;

allyl compounds, for example, an allyl ester (e.g., allyl acetate, allyl caproate, ally caprate, allyl laurate, allyl palpitate, allyl stearate, allyl benzoate, allyl acetoacetate or ally lactate) and allyl oxyethanol;

vinyl ethers, for example, an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether or tetrahydrofurfuryl vinyl ether);

vinyl esters, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate or vinyl cyclohexylcarboxylate;

dialkyl itaconates, for example, dimethyl itaconate, diethyl itaconate or dibutyl itaconate;

monoalkyl or dialkyl fumarates, for example, dibutyl fumarate;

and others, for example, crotonic acid, itaconic acid, maleic anhydride, maleimide, acrylonitrile, methacrylonitrile or maleonitrile.

In addition, any addition-polymerizable unsaturated compounds copolymerizable with monomers corresponding to the repeating units described above may be employed.

A molar ratio of each repeating unit in the acid-decomposable resin of alicyclic hydrocarbon type can be appropriately determined taking the adjustment of many factors including dry etching resistance of resist, standard developing solution aptitude, adhesion to a substrate, resist profile, and other characteristics ordinarily required for resist, for example, resolution, heat resistance and sensitivity into consideration.

The content of the repeating unit having a partial structure containing an alicyclic hydrocarbon represented by any one of formulae (pI) to (pVI) is preferably from 30 to 70% by mole, more preferably from 35 to 65% by mole, and still more preferably from 40 to 60% by mole, based on the total repeating units in the acid-decomposable resin of alicyclic hydrocarbon type.

The content of the repeating unit corresponding to the additional copolymer component described above can be appropriately determined depending on the desired performance of resist. In general, the content is preferably 99% by mole or less, more preferably 90% by mole or less, and still more preferably 80% by mole or less, based on the mole number of the repeating unit having a partial structure containing an alicyclic hydrocarbon represented by any one of formulae (pI) to (pVI).

When the composition of the invention is used for ArF exposure, it is preferred that the acid-decomposable resin does not contain an aromatic group in order to ensure transparency of the ArF beam.

In the acid-decomposable resin of alicyclic hydrocarbon type, a content of the repeating unit having the acid-decomposable group is preferably from 15 to 50% by mole, more preferably from 20 to 40% by mole, based on the total repeating units.

The acid-decomposable resin of alicyclic hydrocarbon type for use in the invention can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent for dissolving the composition of the invention described hereinafter, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction mixture is poured into a solvent to collect the resulting powder or solid, thereby obtaining the desired polymer.

The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

With respect to the repeating structural units described above, they may be used individually or as a mixture of two or more thereof.

In the invention, the resins may be used individually or in combination of two or more thereof.

The weight average molecular weight of the resin in accordance with the invention is ordinarily from 1,000 to 200,000, preferably from 3,000 to 20,000, measured by a GPC method and calculated in terms of polystyrene.

The degree of dispersion (Mw/Mn) is ordinarily from 1 to 10, preferably from 1 to 5, and still more preferably from 1 to 4. The resin having a smaller degree of dispersion shows a better resolution, and provides a better resist shape and a smoother sidewall of the resulting resist pattern, thus being excellent in roughness.

The content of the total resins in accordance with the invention in the positive resist composition of the invention is preferably from 40 to 99.99% by weight, and more preferably from 50 to 99.97% by weight, based on the total solid content of the resist composition.

[2] Compound (B-1) Represented by Formula (I):

The positive resist composition of the invention includes a compound represented by formula (I) described below as a compound that generates an acid upon irradiation of an actinic ray or radiation.

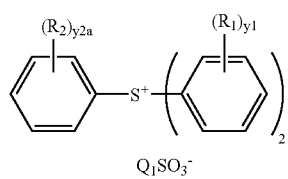

In formula (I), $R_1$ represents an alkyl group, an alicyclic hydrocarbon group, a hydroxy group, a carboxy group, an alkoxy group, a halogen atom or an phenylthio group, which may be the same or different, when two or more $R_1$'s are present; $R_2$ represents an alkyl group, an alicyclic hydrocarbon group, a hydroxy group, a carboxy group, an alkoxy group, a halogen atom or an phenylthio group, which may be the same or different, when two or more $R_2$'s are present, provided that at least one of $R_2$ represents, a fluorine atom, an alkyl group substituted with a fluorine atom, an alicyclic hydrocarbon group substituted with a fluorine atom, an alkoxy group substituted with a fluorine atom or an phenylthio group substituted with a fluorine atom; $y_1$ each independently represents an integer of from 0 to 5; $Y_{2a}$ represents an integer of from 1 to 5, provided that the total number of fluorine atoms included in $(R_2)Y_{2a}$ is 4 or more; and $Q_1$ represents an alkyl group substituted with a fluorine atom, a cycloalkyl group substituted with a fluorine atom, an aryl group substituted with a fluorine atom or an aryl group substituted with a fluorinated alkyl group.

The alkyl group represented by any one of $R_1$ and $R_2$ is preferably an alkyl group having from 1 to 15 carbon atoms and includes a straight chain or branched alkyl group, for example, a methyl group, an ethyl group, a propyl group, a n-butyl group, a sec-butyl group, a tert-butyl group, a pentyl group, a hexyl group, a heptyl group, an octyl group, a nonyl group, a decyl group, an undecyl group, a dodecyl group, a tridecyl group or a tetradecyl group. The alkyl group represented by any one of $R_1$ and $R_2$ may be connected to the benzene ring through an oxygen atom, a sulfur atom, —C(=O)—, —NH— or a combination thereof.

The alicyclic hydrocarbon group represented by any one of $R_1$ and $R_2$ is preferably an alicyclic hydrocarbon group having from 3 to 15 carbon atoms and includes, for example, a cyclopropyl group, a cyclopentyl group, a cyclohexyl group, an adamantyl group and a norbornyl group.

The alkoxy group represented by any one of $R_1$ and $R_2$ includes an alkoxy group corresponding to the alkyl group described above.

The halogen atom represented by any one of $R_1$ and $R_2$ includes a fluorine atom, a chlorine atom, a bromine atom and an iodine atom, and is preferably a fluorine atom.

The alkyl group, alicyclic hydrocarbon group, alkoxy group and phenylthio group represented by any one of $R_1$ and $R_2$ may have a substituent. Examples of the substituent for the alkyl group, alicyclic hydrocarbon group, alkoxy group and phenylthio group represented by any one of $R_1$ and $R_2$ include a halogen atom (e.g., a fluorine atom, a chlorine atom, a bromine atom or an iodine atom), a hydroxy group, an alkyl group, an alkoxy group and an alkylthio group.

In formula (I), at least one of $R_2$ represents a fluorine atom, an alkyl group substituted with a fluorine atom, an alicyclic hydrocarbon group substituted with a fluorine atom, an alkoxy group substituted with a fluorine atom or a phenylthio group substituted with a fluorine atom.

$R_2$ is preferably a fluorine atom or an alkyl group substituted with a fluorine atom. Examples of the alkyl group substituted with a fluorine atom include a perfluoromethyl group, a perfluoroethyl group, a perfluoropropyl group, a perfluorobutyl group, a perfluorohexyl group and a perfluorooctyl group.

In formula (I), the total number of fluorine atoms included in $(R_2)y_{2a}$ is 4 or more, preferably from 4 to 27, and more preferably from 4 to 18.

The alkyl group in $Q_1$ is preferably an alkyl group having from 1 to 30 carbon atoms, for example, a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group or an eicosyl group.

The cycloalkyl group in $Q_1$ is preferably a cycloalkyl group having from 3 to 30 carbon atoms, for example, a cyclopropyl group, a cyclopentyl group, a cyclohexyl group, an adamantyl group, a norbornyl group or a bornyl group.

The aryl group in $Q_1$ is preferably an aryl group having from 6 to 14 carbon atoms, for example, a phenyl group, a tolyl group or a naphthyl group.

The alkyl group, cycloalkyl group and aryl group in $Q_1$ each have a fluorine atom. The number of the fluorine atom included is preferably from 1 to 20, more preferably from 3 to 8.

The fluorinated alkyl group contained in the aryl group in $Q_1$ includes preferably a fluorinated alkyl group having from 1 to 5 carbon atoms, for example, a trifluoromethyl group, a difluoromethyl group, a monofluoromethyl group or a pentafluoromethyl group.

The alkyl group, cycloalkyl group, aryl group and aryl group substituted with a fluorinated alkyl group in $Q_1$ may further have a substituent. Examples of the substituent include a halogen atom (excluding a fluorine atom), an alkyl group, an alkoxy group and an alkylthio group.

Specific examples of the compound represented by formula (I) are set forth below, but the invention should not be construed as being limited thereto.

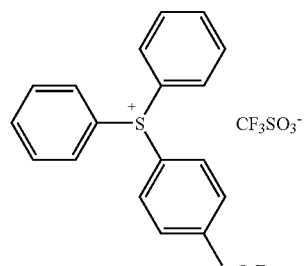
(I)-1

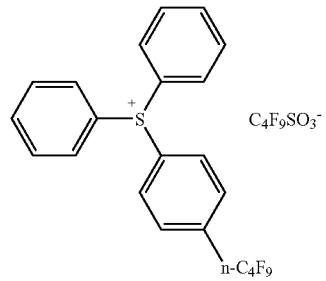
(I)-2

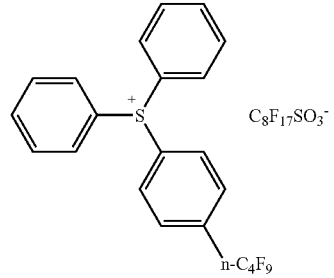
(I)-3

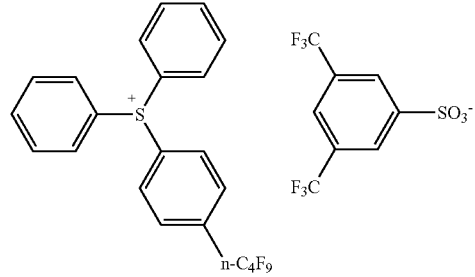
(I)-4

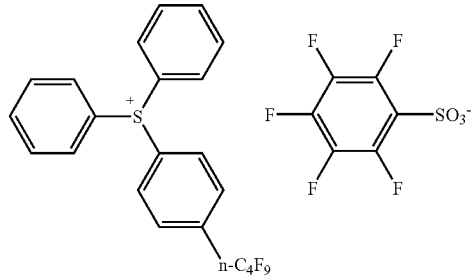
(I)-5

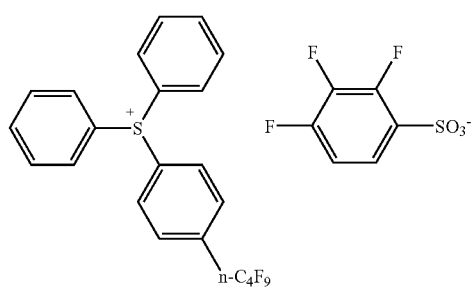
(I)-6

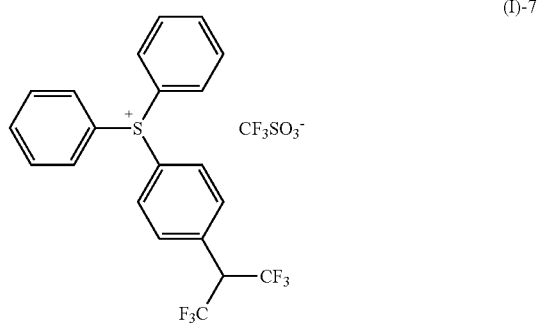
(I)-7

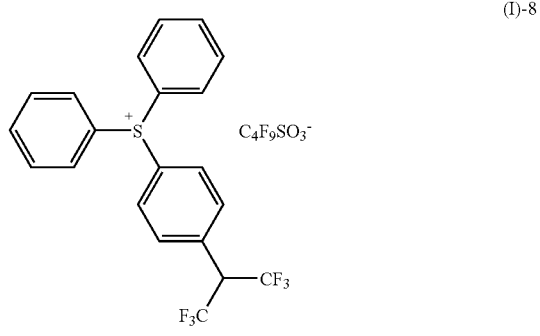
(I)-8

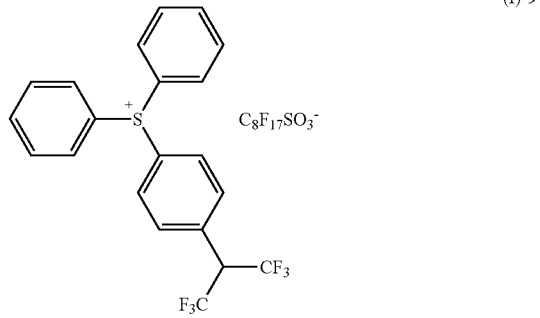
(I)-9

-continued
(I)-10
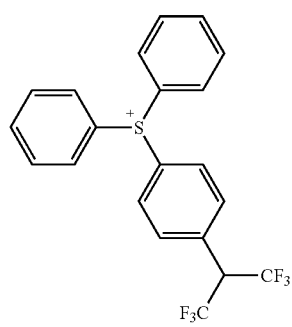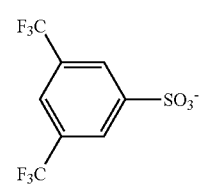
(I)-11
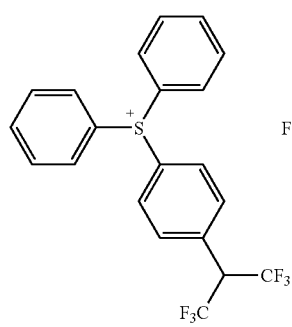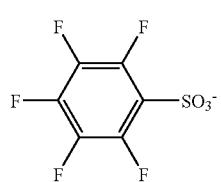
(I)-12
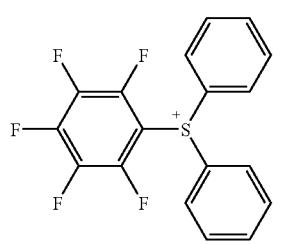 CF$_3$SO$_3^-$
(I)-13
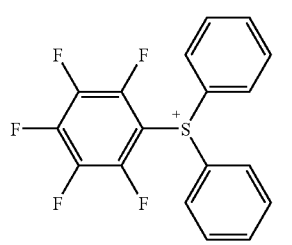 C$_4$F$_9$SO$_3^-$
(I)-14
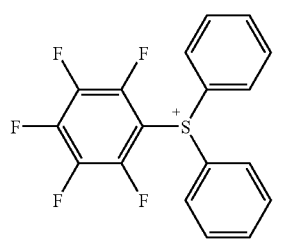 C$_8$F$_{17}$SO$_3^-$
-continued
(I)-15
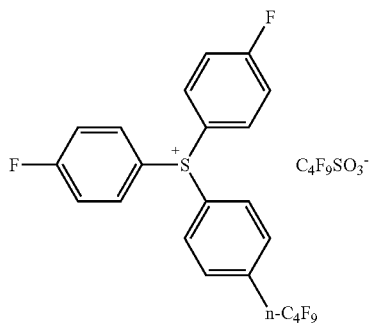 C$_4$F$_9$SO$_3^-$
(I)-16
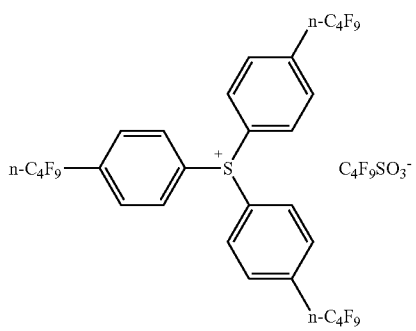 C$_4$F$_9$SO$_3^-$
(I)-17
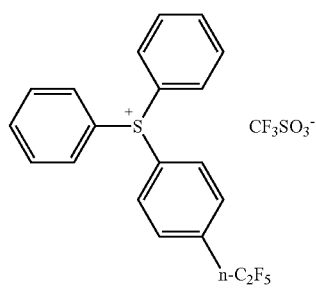 CF$_3$SO$_3^-$
(I)-18
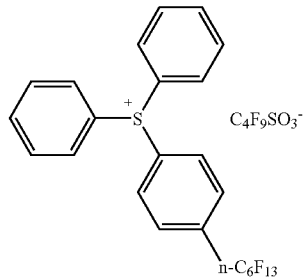 C$_4$F$_9$SO$_3^-$
(I)-19
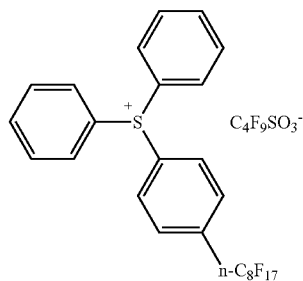 C$_4$F$_9$SO$_3^-$ -continued
(I)-20
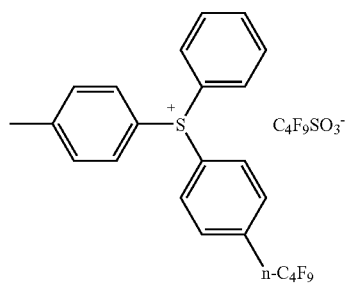
(I)-21
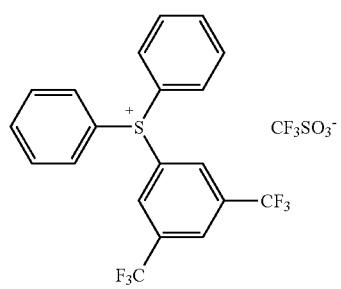
(I)-22
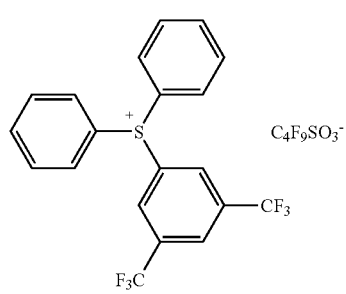
(I)-23
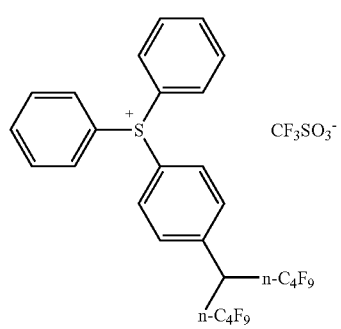
(I)-24
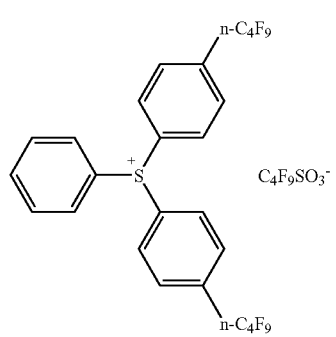
-continued
(I)-25
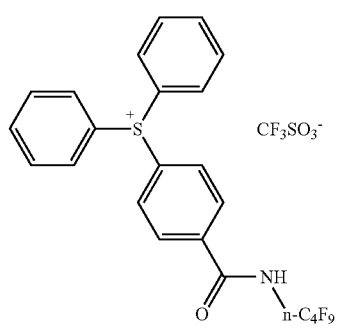
(I)-26
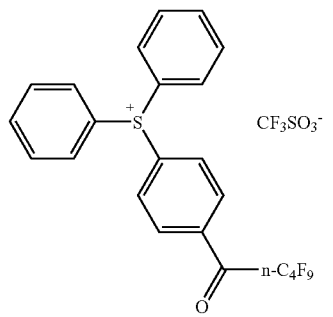
(I)-27
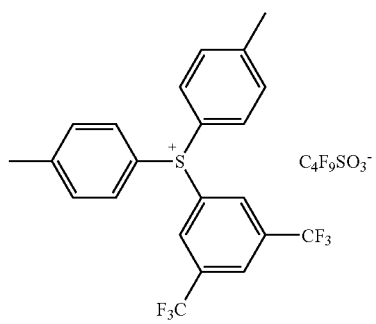
(I)-28
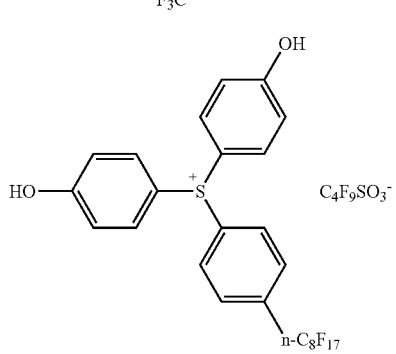
(I)-29
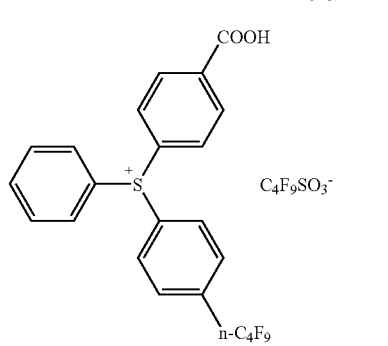

-continued
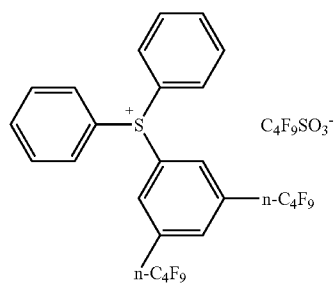 (I)-30
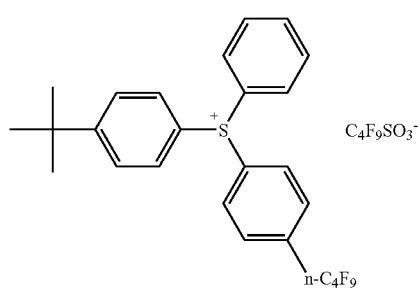 (I)-31
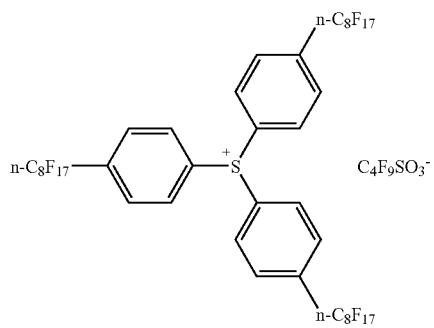 (I)-32
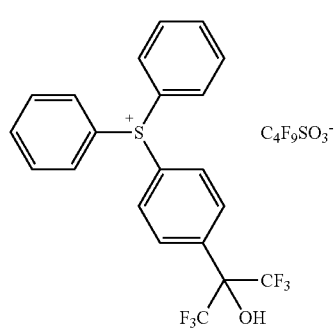 (I)-33
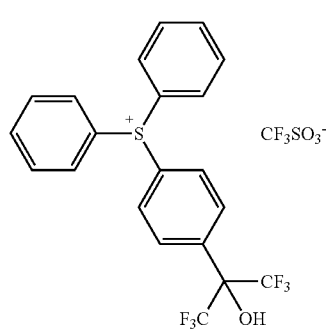 (I)-34
-continued
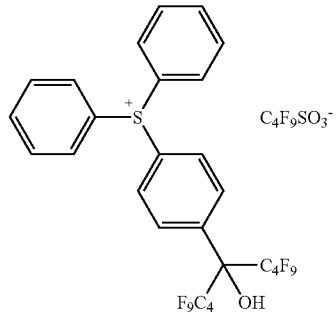 (I)-35
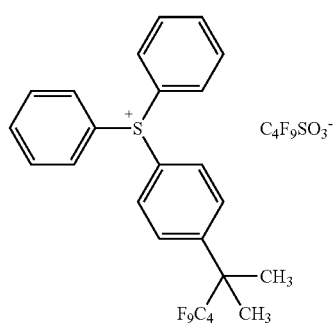 (I)-36
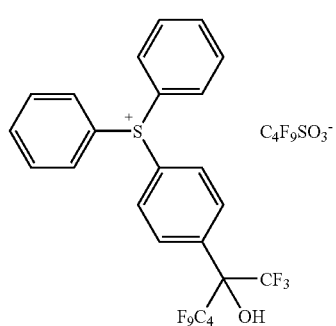 (I)-37
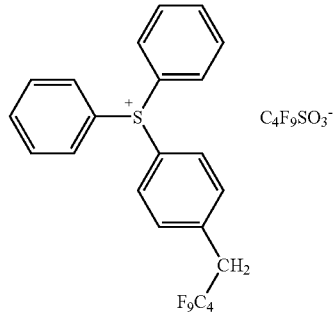 (I)-38
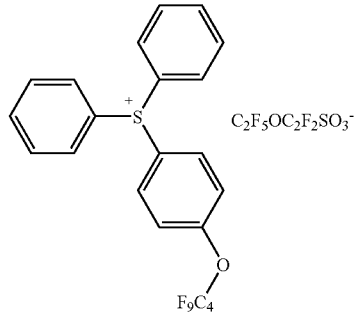 (I)-39

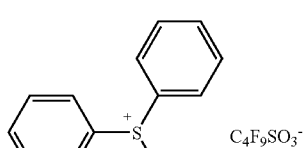
(I)-40

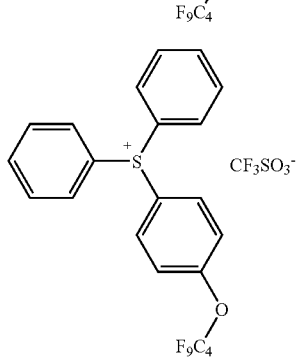
(I)-41

(I)-42

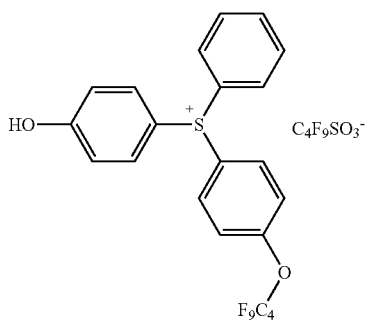
(I)-43

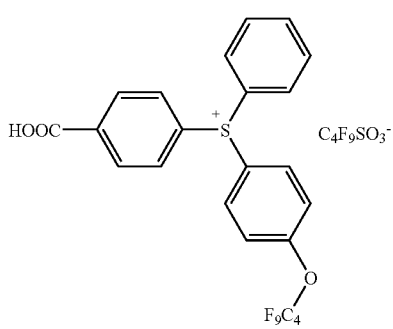
(I)-44

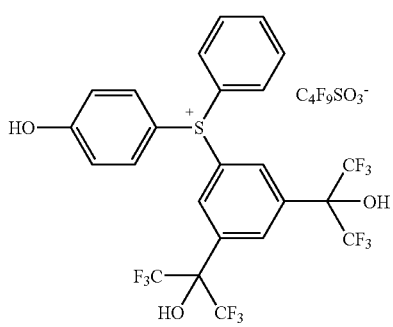

The content of the compound represented by formula (I) is ordinarily from 0.10 to 30% by weight, preferably from 0.50 to 20% by weight, based on the total solid content of the resist composition.

[3] Compound (B-2) Represented by Formula (II) or (III);

The positive resist composition of the invention may further include a compound represented by formula (II) or (III) described below as the compound that generates an acid upon irradiation of an actinic ray or radiation.

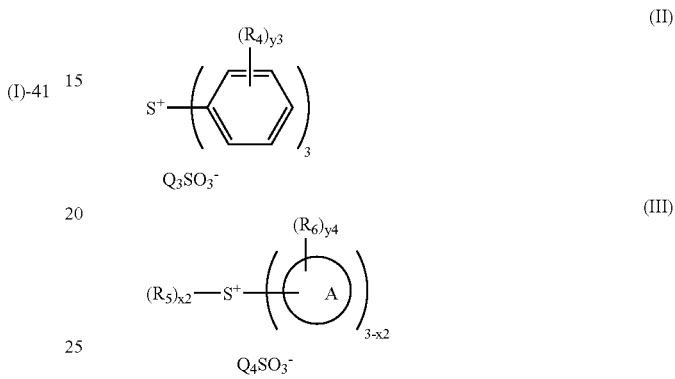

In formulae (II) and (III), $R_4$ represents an alkyl group, an alicyclic hydrocarbon group, a hydroxy group, a carboxy group or an alkoxy group, which may be the same or different, when two or more $R_4$'s are present; $R_5$ represents an alkyl group, an alicyclic hydrocarbon group, which may be the same or different, when two or more $R_5$'s are present, or when two or more $R_5$'s are present, two of $R_5$'s may be combined with each other to form a ring; $R_6$ represents an alkyl group, an alicyclic hydrocarbon group, a hydroxy group, a carboxy group or an alkoxy group, which may be the same or different, when two or more $R_6$'s are present; A represents an aromatic group; $x_2$ represents an integer of from 1 to 3; $y_3$ each independently represents an integer of from 0 to 5; $y_4$ each independently represents an integer of from 0 to 5; and $Q_3$ and $Q_4$ each represents an alkyl group substituted with a fluorine atom, a cycloalkyl group substituted with a fluorine atom, an aryl group substituted with a fluorine atom or an aryl group substituted with a fluorinated alkyl group.

The alkyl group represented by any one of $R_4$ to $R_6$ has the same meaning as the alkyl group represented by any one of $R_1$ and $R_Z$ in formula (I).

The alicyclic hydrocarbon group represented by any one of $R_4$ to $R_6$ has the same meaning as the alicyclic hydrocarbon group represented by any one of $R_1$ and $R_2$ in formula (I).

The alkoxy group represented by any one of $R_4$ to $R_6$ has the same meaning as the alkoxy group represented by any one of $R_1$ and $R_2$ in formula (I).

The alkyl group represented by any one of $R_4$ and $R_6$ may be connected to the benzene ring through an oxygen atom, a sulfur atom, —C(=O)—, —NH— or a combination thereof.

The alkyl group represented by $R_5$ includes an alkyl group connecting to an alkyl group (preferably having from 1 to 15 carbon atoms), an aryl group (preferably a phenyl group) or an alicyclic hydrocarbon group (preferably having from 6 to 15 carbon atoms) through a carbonyl group, an ether group, a thioether group, a phenylene group or a combination thereof. The alkyl group or alicyclic hydrocarbon group represented by $R_5$ may have a substituent, for example, a hydroxy group or an alkoxy group. The alkyl group represented by $R_5$ may further have an alicyclic hydrocarbon group or an aryl group, as the substituent. The alicyclic hydrocarbon group represented by $R_5$ may further have an alkyl group, an aryl group or =O, as the substituent.

When two or more $R_5$'s are present, two of $R_5$'s may be combined with each other to form a ring. In such a case, a group formed by combining two $R_5$'s with each other includes, for example, a butylene group.

The aromatic group or heterocyclic group (containing a hetero atom, for example, an oxygen atom, a sulfur atom or a nitrogen atom in the hetero ring) represented by A may be derived from a monocyclic ring or polycyclic ring preferably having from 5 to 20 carbon atoms, for example, a benzene ring, a furan ring, a thiophene ring, a benzofuran ring, a benzothiophene ring, a naphthalene ring or a anthracene ring.

Each of $Q_3$ and $Q_4$ has the same meaning as $Q_1$ in formula (I).

Specific examples of the compound represented by any one of formulae (II) and (III) are set forth below, but the invention should not be construed as being limited thereto.

II-1

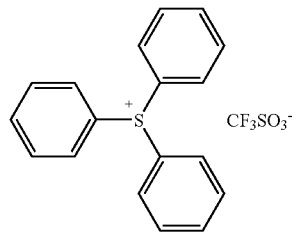

II-2

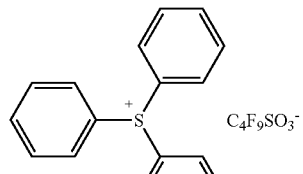

II-3

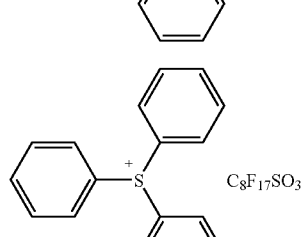

II-4

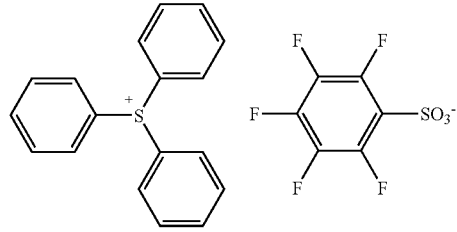

II-5

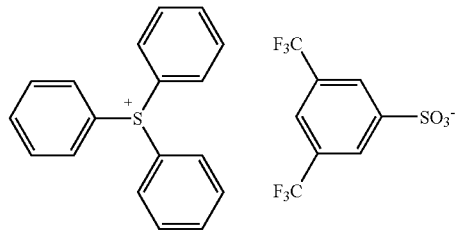

II-6

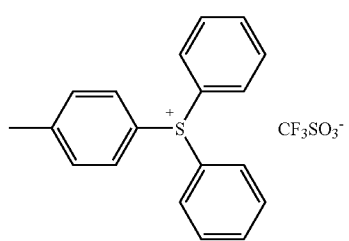

II-7

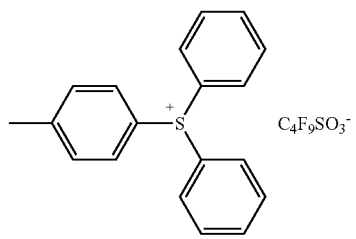

II-8

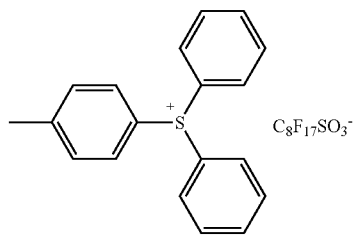

II-9

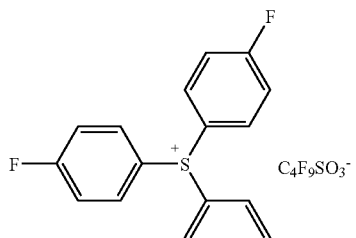

II-10

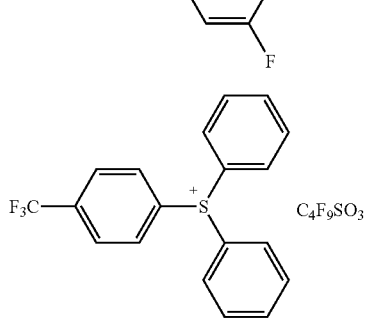

-continued
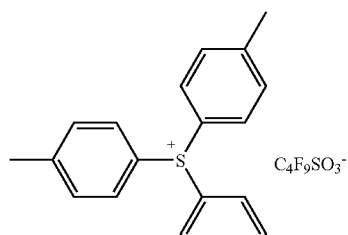
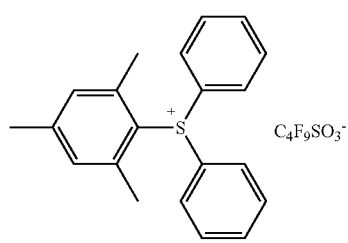
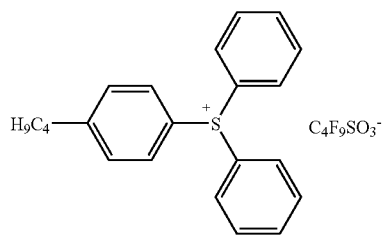
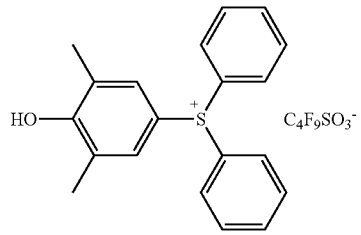
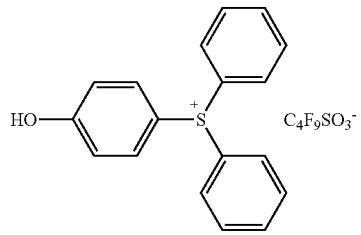
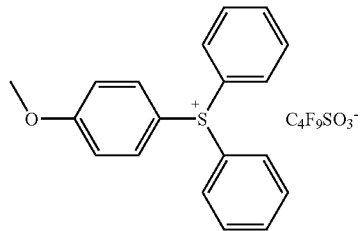
-continued
II-11
II-12
II-13
II-14
II-15
II-16
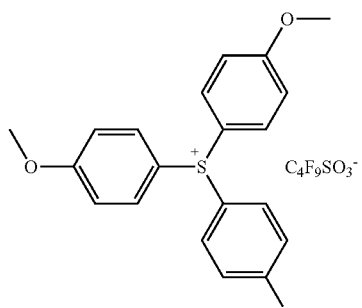
II-17
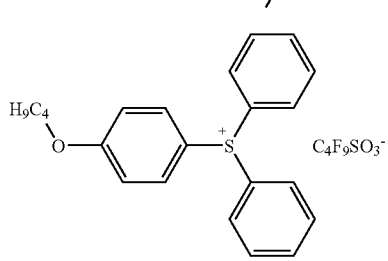
II-18
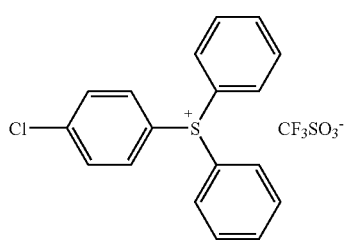
II-19
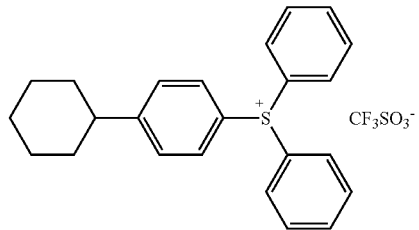
II-20
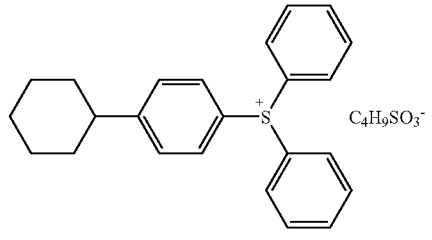
II-21
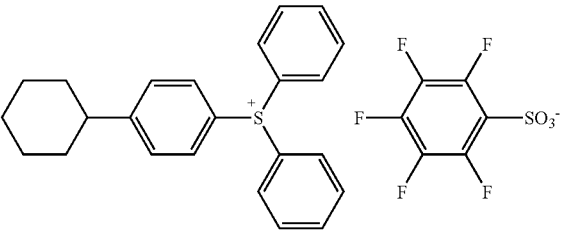
II-22

-continued
II-23
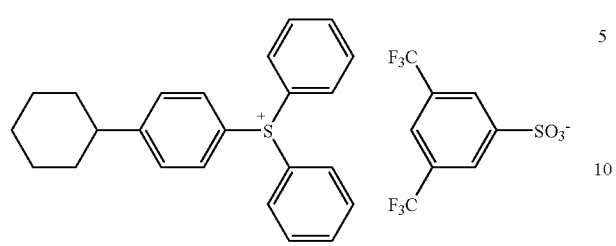
II-24
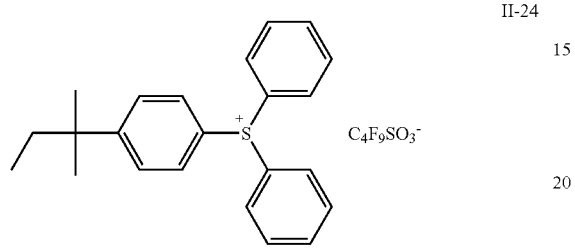
II-25
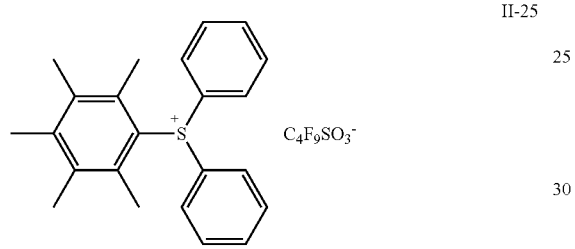
II-26
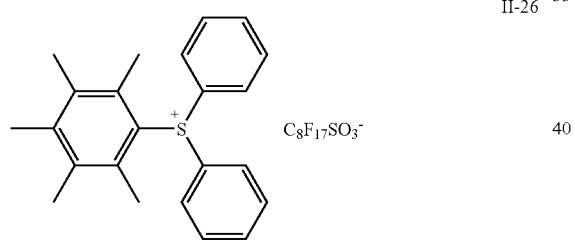
II-26
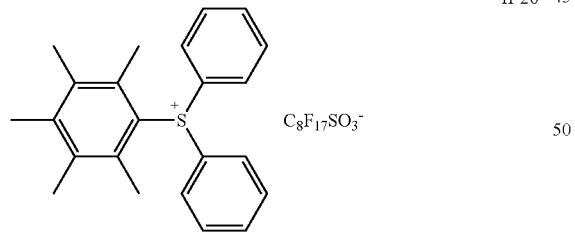
II-27
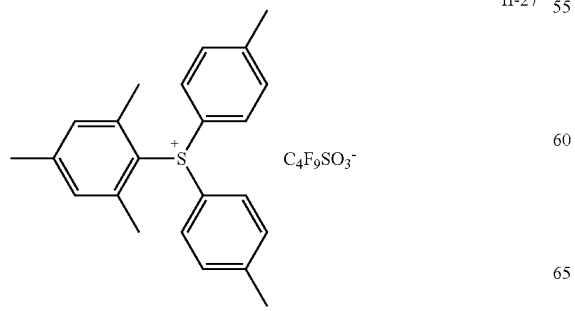
-continued
II-28
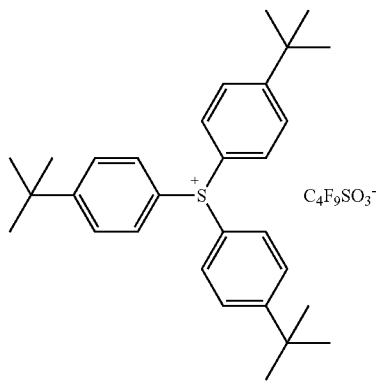
II-29
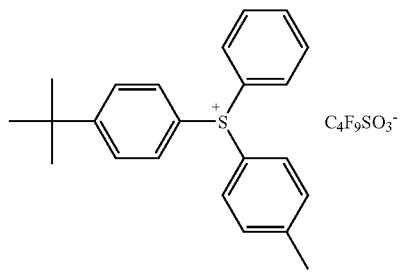
II-30
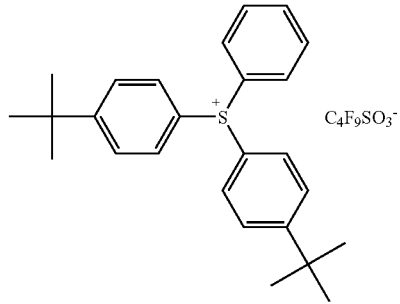
II-31
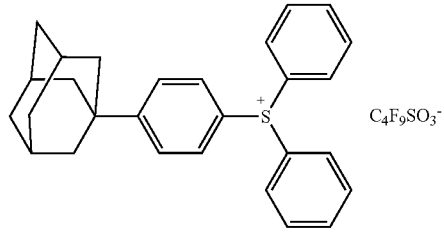
II-32
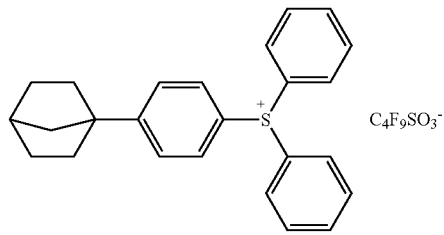

-continued
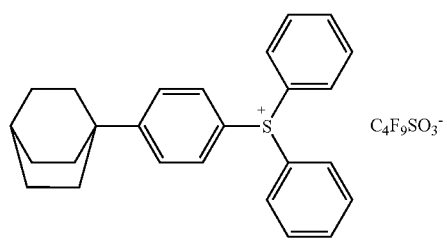  II-33
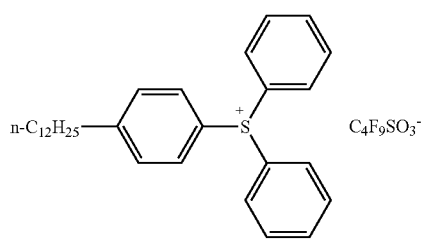  II-34
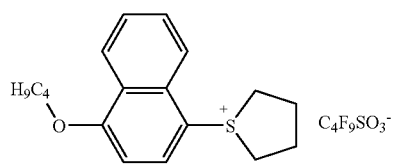  III-1
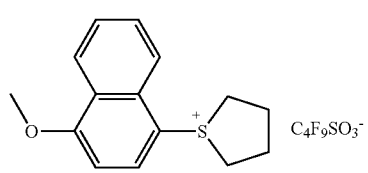  III-2
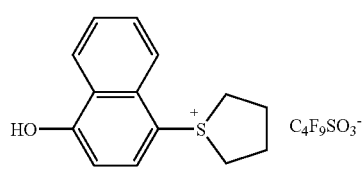  III-3
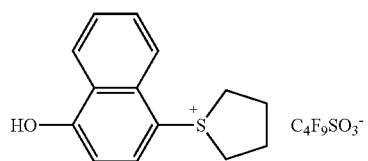  III-4
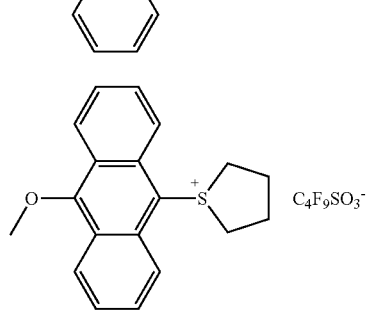  III-5
-continued
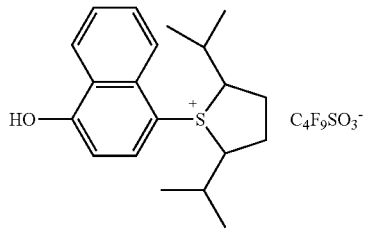  III-6
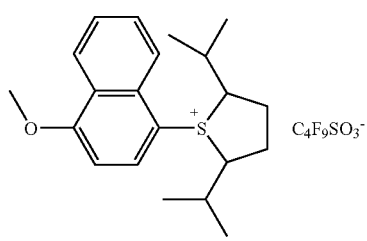  III-7
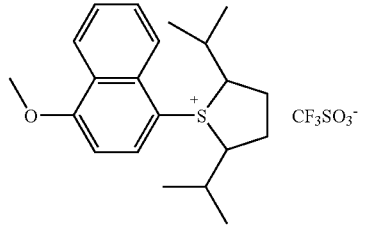  III-8
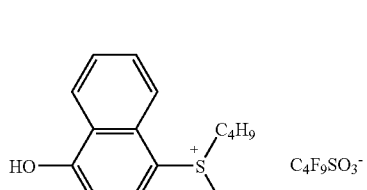  III-9
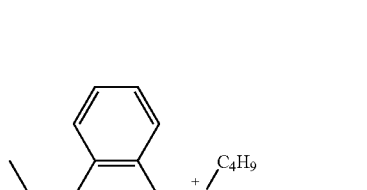  III-10
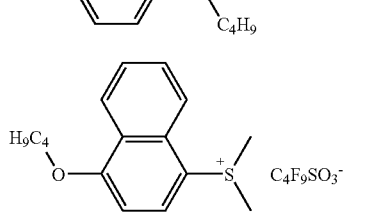  III-11
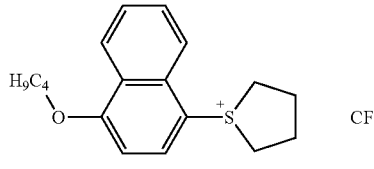  III-12
III-13

-continued
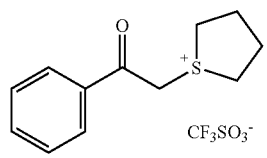 III-14
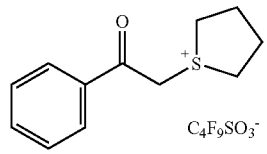 III-15
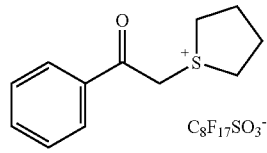 III-16
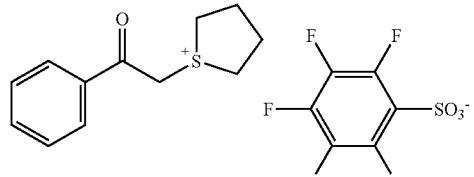 III-17
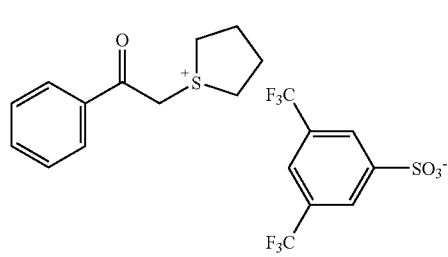 III-18
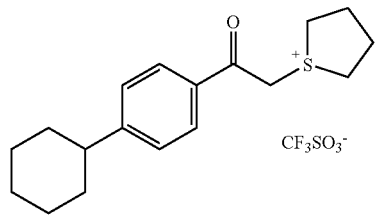 III-19
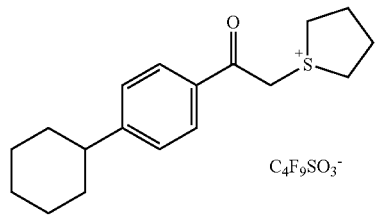 III-20
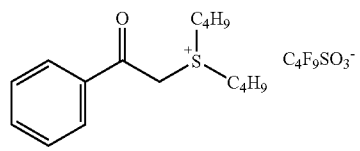 III-21
-continued
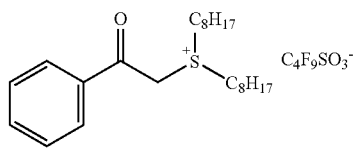 III-22
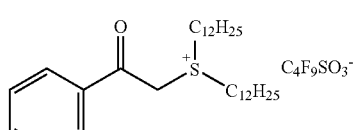 III-23
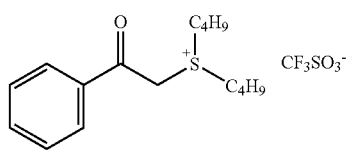 III-24
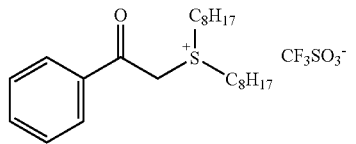 III-25
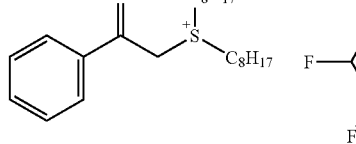 III-26
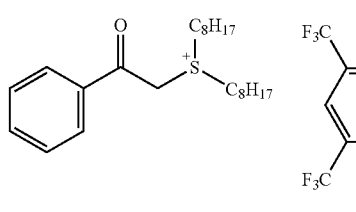 III-27
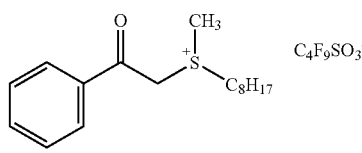 III-28
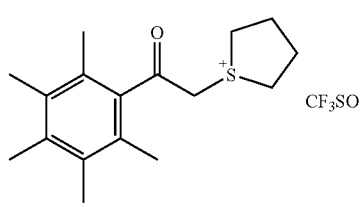 III-29
III-30

-continued
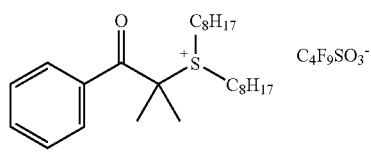 III-31
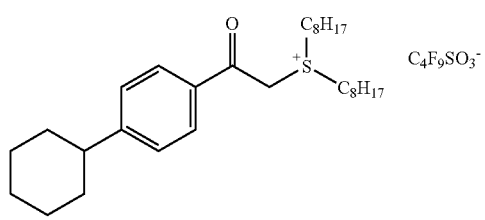 III-32
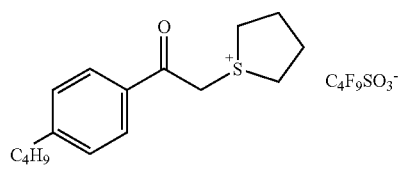 III-33
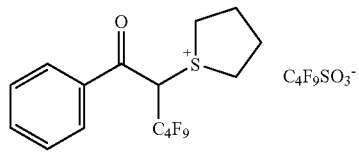 III-34
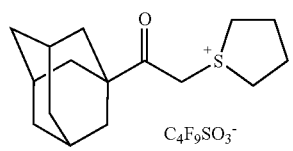 III-35
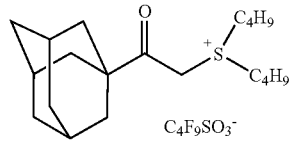 III-36
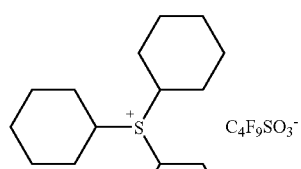 III-37
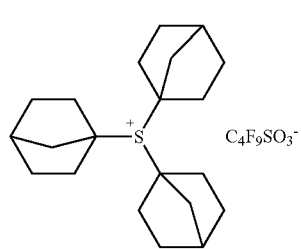 III-38
-continued
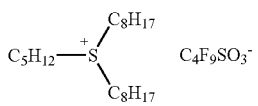 III-39
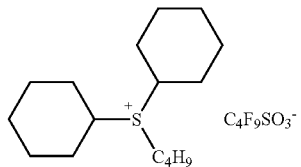 III-40
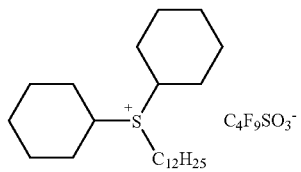 III-41
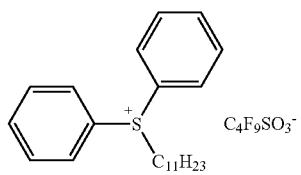 III-42
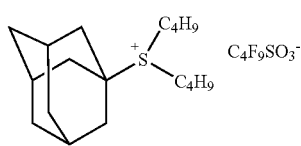 III-43
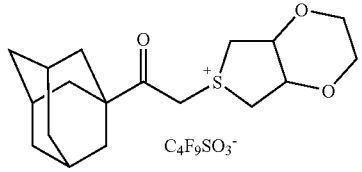 III-44
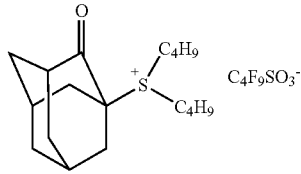 III-45
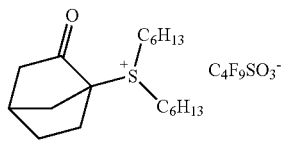 III-46
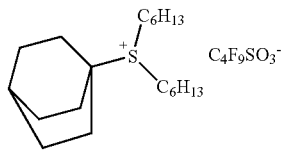 III-47

-continued

III-48
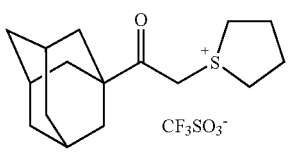

III-49
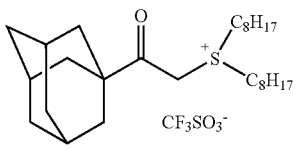

III-50
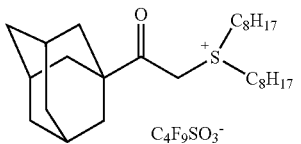

III-51
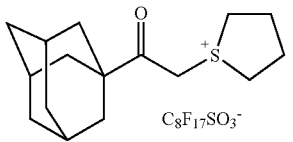

III-52
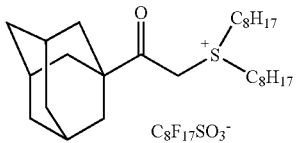

III-53
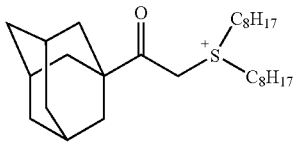

III-54
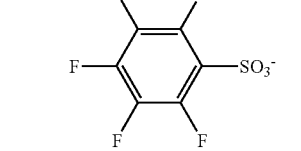

III-55
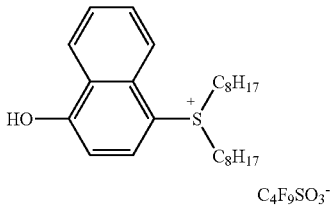

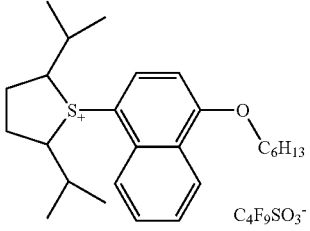

The compound represented by any one of formulae (II) and (III) can be synthesized according to known methods.

More specifically, the compound represented by formula (III), for example, Compound of III-21 can be obtained by reacting a phenacyl halogenide derivative, for example, phenacyl bromide, with a sulfide in an appropriate solvent without a catalyst or in the presence of a silver catalyst to form a phenacyl dialkyl sulfonium salt and subjecting the phenacyl dialkyl sulfonium salt to salt exchange with a corresponding anion. Other compounds can be also obtained in the above-described procedures using corresponding halogenide derivatives and sulfides.

The compound represented by formula (II) can be synthesized in the same manner as the description of sulfonium compound on page 36, paragraph [0098], lines 16 to 27 of JP-A-2000-47387.

The total content of the compounds represented by formulae (II) and (III) is ordinarily from 0.10 to 25% by weight, preferably from 0.50 to 23% by weight, and more preferably from 1.0 to 20% by weight, based on the total solid content of the resist composition.

[4] Other Compound that Generates an Acid Upon Irradiation of an Actinic Ray or Radiation:

The positive resist composition of the invention may contain as the compound that generates an acid upon irradiation of an actinic ray or radiation, other compound (hereinafter also referred to as a "photo-acid generator").

The photo-acid generator can be appropriately selected from photoinitiators for photo-cationic polymerization, photoinitiators for photo-radical polymerization, photo-achromatic agents for dyes, photo-discoloring agents, known compounds capable of generating an acid upon irradiation of an actinic ray or radiation used for microresist and mixtures thereof.

Examples of the photo-acid generator include an onium salt, for example, a diazonium salt, an ammonium salt, a phosphonium salt, an iodonium salt, a selenonium salt or an arsonium salt, an organic halogeno compound, an organometal/organic halide, a photo-acid generator having an o-nitrobenzyl type protective group, a compound that generates a sulfonic acid upon photolysis, which is represented by iminosulfonate, and a disulfone compound.

Also, a polymer compound in which a group or compound capable of generating an acid upon irradiation of an actinic ray or radiation is introduced into the main chain or side chain thereof, for example, compounds as described, for example, in U.S. Pat. No. 3,849,137, German Patent 3,914,407, JP-A-63-26653, JP-A-55-164824, JP-A-62-69263, JP-A-63-146038, JP-A-63-163462, JP-A-62-153853 and JP-A-63-146029 may be used.

Further, compounds capable of generating an acid with light described, for example, in U.S. Pat. No. 3,779,778 and European Patent 126,712 may be used.

Of the other compounds that are decomposed to generate an acid upon irradiation of an actinic ray or radiation, those which can be effectively used are described below.

(1) Iodonium Salts Represented by Formula (PAG1) Shown Below:

In formula (PAG1), $Ar^1$ and $Ar^2$ each independently represents an aryl group. Preferred examples of the substituent for the aryl group represented by any one of Ar¹ and Ar² include an alkyl group, a haloalkyl group, a cycloalkyl group, an aryl group, an alkoxy group, a nitro group, a carboxy group, an alkoxycarbonyl group, a hydroxy group, a mercapto group and a halogen atom.

Z⁻ represents a counter anion. Examples of the counter anion include $BF_4^-$, $AsF_6^-$, $PF_6^-$, $SbF_6^-$, $SiF_6^{2-}$, $ClO_4^-$, a perfluoroalkanesulfonic acid anion, e.g., $CF_3SO_3^-$, a pentafluorobenzenesulfonic acid anion, a condensed polynucleic aromatic sulfonic acid anion, e.g., a naphthalene-1-sulfonic acid anion, an anthraquinonesulfonic acid anion, and a dye containing a sulfonic acid group. However, the invention should not be construed as being limited thereto.

Alternatively, Ar¹ and Ar² may be combined with each other through a single bond or a substituent.

Specific examples of the compound are set forth below, but the invention should not be construed as being limited thereto.

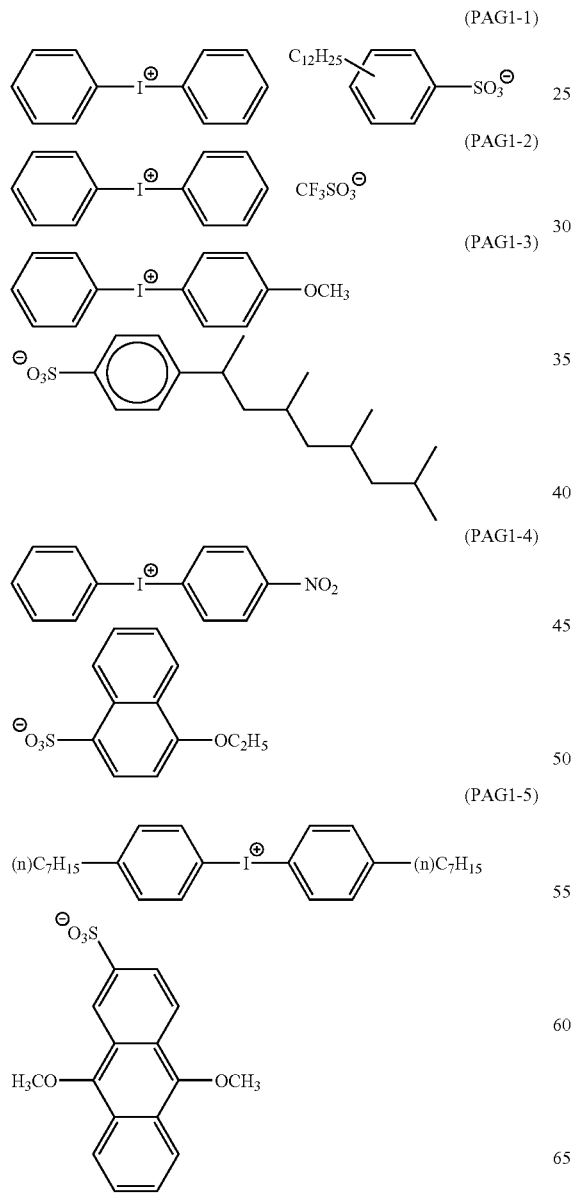

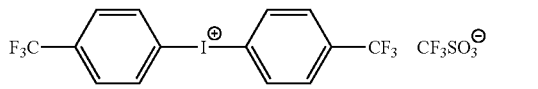

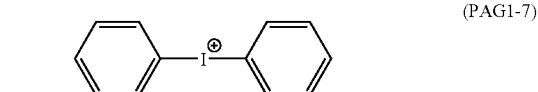

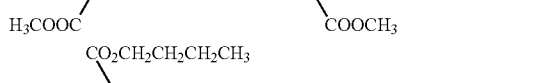

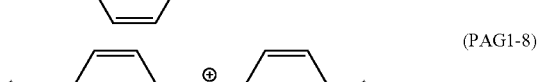

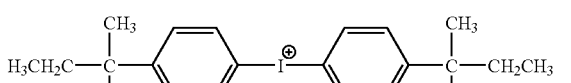

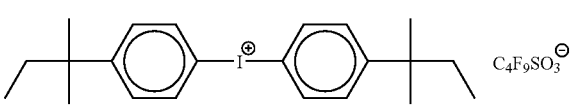

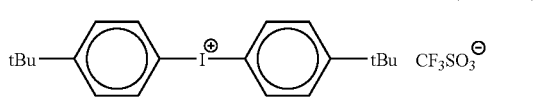

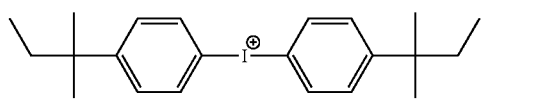

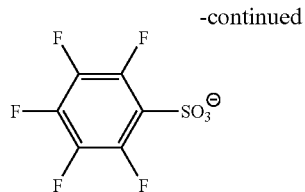
(PAG3-6) 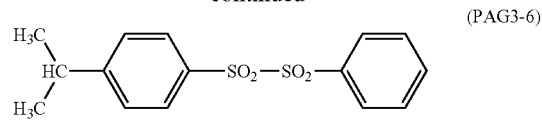

The onium salts represented by formula (PAG1) are known and can be synthesized by methods as described, for example, in U.S. Pat. Nos. 2,807,648 and 4,247,473 and JP-A-53-101331.

(2) Disulfone Derivatives Represented by Formula (PAG3) Shown Below or Iminosulfonate Derivatives Represented by Formula (PAG4) Shown Below:

(PAG3-7) 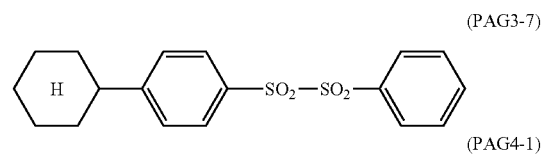

$$Ar^3-SO_2-SO_2-Ar^4 \quad \text{(PAG3)}$$

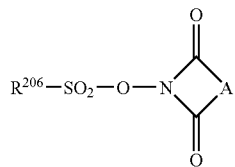 (PAG4)

(PAG4-1) 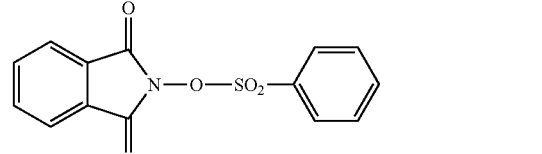

In formulae (PAG3) and (PAG4), $Ar^3$ and $Ar^4$ each independently represents an aryl group.

$R^{206}$ represents an alkyl group or an aryl group; and A represents an alkylene group, an alkenylene group or an arylene group.

Specific examples of the compound are set forth below, but the invention should not be construed as being limited thereto.

(PAG4-2) 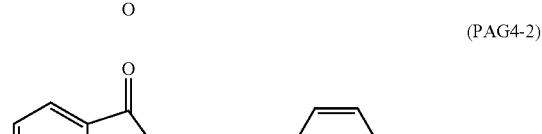

(PAG3-1) 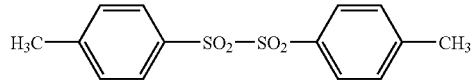

(PAG4-3) 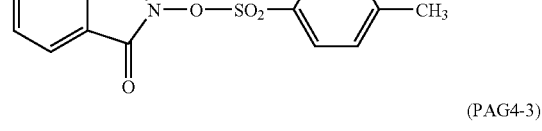

(PAG3-2) 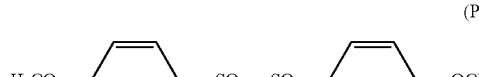

(PAG4-4) 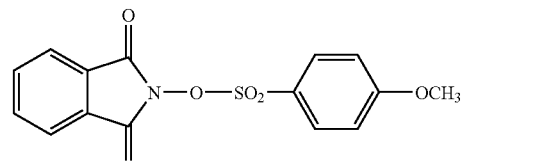

(PAG3-3) 

(PAG4-5) 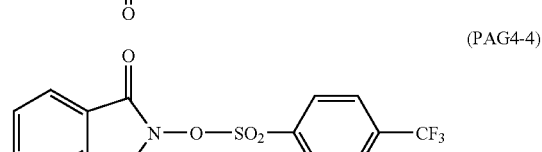

(PAG3-4) 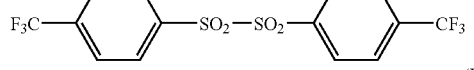

(PAG4-6) 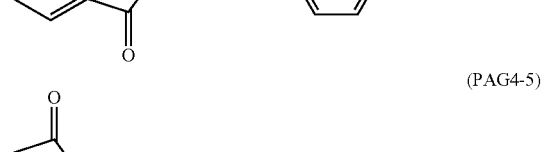

(PAG3-5) 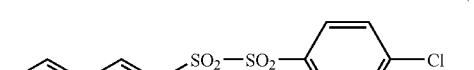

(PAG4-7) 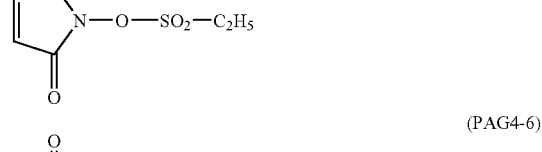

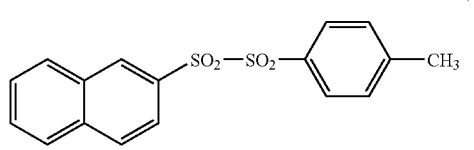

(3) Diazodisulfone Derivatives Represented by Formula (PAG5) Shown Below:

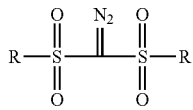

In formula (PAG5), R represents an alkyl group, a cycloalkyl group or an aryl group.

Specific examples of the compound are set forth below, but the invention should not be construed as being limited thereto.

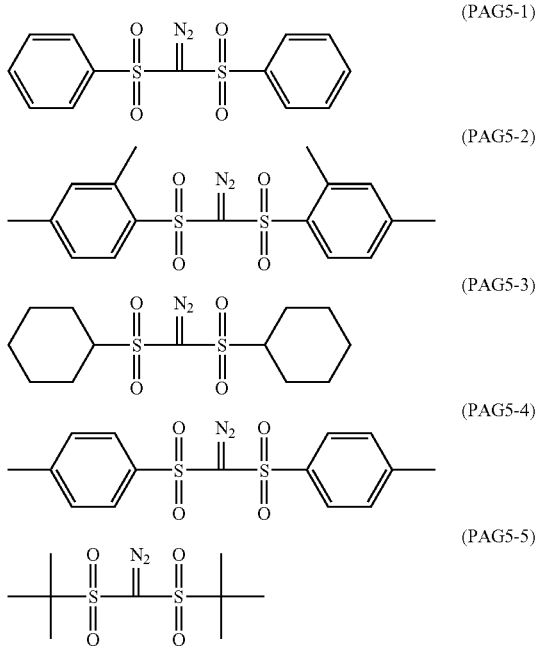

The content of the other compound that generates an acid upon irradiation of an actinic ray or radiation is ordinarily from 0.10 to 25% by weight, preferably from 0.50 to 23% by weight, and more preferably from 1.0 to 20% by weight, based on the total solid content of the resist composition.

[5] (C) Solvent:

With the positive resist composition of the invention, it is preferred to use a mixed solvent as the solvent. Examples of the mixed solvent include those which contain at least one solvent selected from propylene glycol monoalkyl ether carboxylates (hereinafter also referred to as "group A solvent"), at least one solvent selected from propylene glycol monoalkyl ethers, alkyl lactates and alkyl alkoxypropionates (hereinafter also referred to as "group B solvent") and/or at least one solvent selected from γ-butyrolactone, ethylene carbonate, propylene carbonate and cyclohexanone (hereinafter also referred to as "group C solvent"). Specifically, as the mixed solvent, a combination of a group A solvent and a group B solvent, a combination of a group A solvent and a group C solvent, and a combination of a group A solvent, a group B solvent and a group C solvent may be used.

Preferred examples of the propylene glycol monoalkyl ether carboxylate include propylene glycol monomethyl ether acetate, propylene glycol monomethyl ether propionate, propylene glycol monoethyl ether acetate and propylene glycol monoethyl ether propionate.

Preferred examples of the propylene glycol monoalkyl ether include propylene glycol monomethyl ether and propylene glycol monoethyl ether. Preferred examples of the alkyl lactate include methyl lactate and ethyl lactate. Preferred examples of the alkyl alkoxypropionate include ethyl 3-ethoxypropionate, methyl 3-methoxypropionate, ethyl 3-methoxypropionate and methyl 3-ethoxypropionate.

The ratio by weight of the group A solvent to the group B solvent used (A:B) is preferably from 90:10 to 15:85, more preferably from 85:15 to 20;80, and still more preferably from 80:20 to 25:75.

The ratio by weight of the group A solvent to the group C solvent used (A:C) is preferably from 99.9:0.1 to 75:25, more preferably from 99:1 to 80:20, and still more preferably from 97:3 to 85:15.

In the case of combining three groups of solvents, the ratio by weight of the group C solvent used is preferably from 0.1 to 25% by weight, more preferably from 1 to 20% by weight, and still more preferably from 3 to 17% by weight, based on the total solvents.

In the invention, it is preferred to dissolve the above-described components in the mixed solvent so that the solid content of the composition containing the above-described components becomes preferably from 3 to 25% by weight, more preferably from 4 to 20% by weight, and still more preferably from 5 to 15% by weight.

Preferred examples of the mixed solvent for use in the invention containing propylene glycol monoalkyl ether carboxylate include:

propylene glycol monomethyl ether acetate+propylene glycol monomethyl ether;

propylene glycol monomethyl ether acetate+ethyl lactate;

propylene glycol monomethyl ether acetate+3-ethoxyethyl propionate;

propylene glycol monomethyl ether acetate+γ-butyrolactone;

propylene glycol monomethyl ether acetate+ethylene carbonate;

propylene glycol monomethyl ether acetate+propylene carbonate;

propylene glycol monomethyl ether acetate+cyclohexanone;

propylene glycol monomethyl ether acetate+propylene glycol monomethyl ether+γ-butyrolactone;

propylene glycol monomethyl ether acetate+ethyl lactate+γ-butyrolactone;

propylene glycol monomethyl ether acetate+3-ethoxyethyl propionate+γ-butyrolactone;

propylene glycol monomethyl ether acetate+propylene glycol monomethyl ether+ethylene carbonate;

propylene glycol monomethyl ether acetate+ethyl lactate+ethylene carbonate;

propylene glycol monomethyl ether acetate+3-ethoxyethyl propionate+ethylene carbonate;

propylene glycol monomethyl ether acetate+propylene glycol monomethyl ether+propylene carbonate;

propylene glycol monomethyl ether acetate+ethyl lactate+propylene carbonate;

propylene glycol monomethyl ether acetate+3-ethoxyethyl propionate+propylene carbonate; and propylene glycol monomethyl ether acetate+propylene glycol monomethyl ether+cyclohexanone.

Particularly preferred combinations of the solvents include:

propylene glycol monomethyl ether acetate+propylene glycol monomethyl ether;
propylene glycol monomethyl ether acetate+propylene glycol monomethyl ether+γ-butyrolactone;
propylene glycol monomethyl ether acetate+ethyl lactate+γ-butyrolactone;
propylene glycol monomethyl ether acetate+3-ethoxyethyl propionate+γ-butyrolactone;
propylene glycol monomethyl ether acetate+propylene glycol monomethyl ether+ethylene carbonate;
propylene glycol monomethyl ether acetate+ethyl lactate+ethylene carbonate;
propylene glycol monomethyl ether acetate+3-ethoxyethyl propionate+ethylene carbonate;
propylene glycol monomethyl ether acetate+propylene glycol monomethyl ether+propylene carbonate;
propylene glycol monomethyl ether acetate+ethyl lactate+propylene carbonate;
propylene glycol monomethyl ether acetate+3-ethoxyethyl propionate+propylene carbonate;
propylene glycol monomethyl ether acetate+propylene glycol monomethyl ether+cyclohexanone; and
propylene glycol monomethyl ether acetate+cyclohexanone.

To the mixed solvent may be added other solvent. Such other solvent is ordinarily added in an amount of 30 parts by weight or less per 100 parts by weight of the mixed solvent according to the invention. Examples of the other solvent include ethylene dichloride, cyclopentanone, methyl ethyl ketone, toluene, N,N-dimethylformamide, dimethylsulfoxide, N-methylpyrrolidone and tetrahydrofuran.

It is preferred to use the mixed solvent for the positive resist composition of the invention, but a solvent, for example, propylene glycol monomethyl ether acetate, propylene glycol monomethyl ether or cyclohexanone may be used as a single solvent, if desired.

The solid concentration in the positive resist composition is preferably from 3 to 25% by weight, more preferably from 4 to 20% by weight, and still more preferably from 5 to 15% by weight.

[6] (D) Nitrogen-Containing Basic Compound;

Now, a nitrogen-containing basic compound (D) preferably used in the positive resist composition of the invention will be described below. As the nitrogen-containing basic compound (D), there can be used, for example, organic amines, basic ammonium salts and basic sulfonium salts, which do not deteriorate sublimation property and resist performance.

Of the nitrogen-containing basic compounds, the organic amines are preferred from the standpoint of providing excellent image characteristics.

For instance, basic compounds described, for example, in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term "JP-T" as used herein means a "published Japanese translation of a PCT patent application"), U.S. Pat. Nos. 5,525,453, 5,629,134 and 5,667,938 can be used.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine and tributylamine.

Of the compounds, organic amines, for example, 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenyl ether, triethylamine or tributylamine are preferred.

The content of the nitrogen-containing basic compound (D) is ordinarily from 0.001 to 10% by weight, preferably from 0.001 to 5% by weight, and still more preferably from 0.001 to 0.5% by weight, based on the total solid content of the positive resist composition.

The nitrogen-containing basic compounds (D) can be used individually or in combination of two or more thereof.

[7] (E) Fluorine-Based and/or Silicon-Based Surfactant:

It is preferred that the positive resist composition of the invention further contains one or more of fluorine-based and/or silicon-based surfactants (E) (a fluorine atom-containing surfactant, a silicon atom-containing surfactant and a surfactant containing both a fluorine atom and a silicon atom).

By the incorporation of the above-described surfactant (E), the positive resist composition of the invention can provide, at high sensitivity and good resolution, resist patterns having good adhesion and less development defect, when an exposure light source of 250 nm or less, particularly, 220 nm or less is used.

Examples of the surfactant (E) include those described, for example, in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surfactants described below may also be used as they are.

Examples of the commercially available surfactant used include fluorine-based surfactants or silicon-based surfactants, e.g., Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-based surfactant.

As the surfactant, there may be used a surfactant comprising a polymer having a fluoroaliphatic group derived from a fluoroaliphatic compound produced by a telomerization process (also referred to as a telomer process) or an oliogomerization process (also referred to as an oligomer process), in addition to the known surfactants described above. The fluoroaliphatic compound can be synthesized according to methods described in JP-A-2002-90991.

As the polymer having a fluoroaliphatic group, a copolymer between a monomer having a fluoroaliphatic group and (poly(oxyalkylene)) acrylate and/or (poly(oxyalkylene)) methacrylate is preferred. The copolymer may be a random copolymer or a block copolymer. Examples of the poly (oxyalkylene) group include a poly(oxyethylene) group, a poly(oxypropylene) group and a poly(oxybutylene) group. Also, the poly(oxyalkylene) group may be a unit having alkylene moieties different in chain length within the same chain, for example, poly(oxyethylene/oxypropylene/oxyethylene block linkage) or poly(oxyethylene/oxypropylene block linkage). Further, in addition to the copolymer between the monomer having a fluoroaliphatic group and (poly(oxyalkylene)) acrylate (or methacrylate), a copolymer of three or more comonomers obtained, for example, by copolymerization of two or more monomers having fluoroaliphatic group different from each other and two or more (poly(oxyalkylene)) acrylates (or methacrylates) different from each other may be used as well.

Examples of the commercially available polymeric surfactant include Megafac F178, F-470, F-473, F-475, F-476 and F-472 (manufactured by Dainippon Ink and Chemicals, Inc.). Further, there may be illustrated a copolymer between an acrylate (or methacrylate) having a $C_6F_{13}$ group and (poly(oxyalkylene)) acrylate (or methacrylate), a copolymer between an acrylate (or methacrylate) having a $C_6F_{13}$ group, (poly(oxyethylene)) acrylate (or methacrylate) and (poly(oxypropylene)) acrylate (or methacrylate), a copolymer between an acrylate (or methacrylate) having a $C_8F_{17}$ group and (poly(oxyalkylene)) acrylate (or methacrylate), and a copolymer between an acrylate (or methacrylate) having a $C_8F_{17}$ group, (poly(oxyethylene)) acrylate (or methacrylate) and (poly(oxypropylene)) acrylate (or methacrylate).

The amount of surfactant (E) used is preferably from 0.0001 to 2% by weight, and more preferably from 0.001 to 1% by weight, based on the total amount of the positive resist composition (excluding the solvent).

The positive-working resist composition of the invention may contain, if desired, a low-molecular, acid-decomposable compound having a molecular weight of 2,000 or less, having a group capable of being decomposed by the action of an acid and increasing solubility in alkali by the action of an acid.

For instance, alicyclic compounds having an acid decomposable group, for example, a cholic acid derivative, a dehydrocholic acid derivative, deoxycholic acid derivative, a lithocholic acid derivative, an ursocholic acid derivative and an abietic acid derivative as described in *Proc. of SPIE*, 2724, 355 (1966), JP-A-8-15865, U.S. Pat. Nos. 5,310,619 and 5,372,912, *J. Photopolym. Sci. Tech.*, Vol.10, No.3, 511(1997) and aromatic compounds having an acid-decomposable group, for example, a naphthalene derivative may be used as the low-molecular, acid-decomposable compound.

Further, low-molecular, acid-decomposable, dissolution inhibiting compounds described in JP-A-6-51519 can be used in an amount that does not deteriorate transmittance at 220 nm, and 1,2-naphthoquinonediazide compounds may also be used.

In the case of using the low-molecular, acid-decomposable, dissolution inhibiting compound in the resist composition of the invention, the content thereof is ordinarily from 0.5 to 50% by weight, preferably from 0.5 to 40% by weight, more preferably from 0.5 to 30% by weight, and particularly preferably from 0.5 to 20.0% by weight, based on the total solid content of the resist composition.

The addition of the low-molecular, acid-decomposable, dissolution inhibiting compound serves to more improve the development defect described above and improve dry etching resistance.

Into the positive resist composition of the invention may further be incorporated, if desired, a compound for accelerating dissolution in a developing solution, an antihalation agent, a plasticizer, a surfactant, a photosensitizer, an adhesion auxiliary, a cross-linking agent, a photo base generator, or the like.

Examples of the compound for accelerating dissolution in a developing solution for use in the invention include low-molecular compounds having a molecular weight of 1,000 or less, for example, compounds having two or more phenolic hydroxyl groups described in JP-A-3-206458, naphthols, e.g., 1-naphthol, compounds having one or more carboxy groups, carboxylic acid anhydrides, sulfonamide compounds and sulfonylimide compounds.

The amount of the compound for accelerating dissolution in a developing solution is preferably 30% by weight or less, and more preferably 20% by weight or less, based on the total amount (solid content) of the resist composition.

Preferred examples of the antihalation agent include compounds capable of effectively absorbing irradiated radiation, for example, substituted benzenes, e.g., fluorene, 9-fluorenone or benzophenone; and polycyclic aromatic compounds, e.g., anthracene, anthracene-9-methanol, anthracene-9-carboxyethyl, phenanthrene, perylene or azirene. Of these compounds, polycyclic aromatic compounds are particularly preferred. The antihalation agent functions to decrease reflected light from a substrate and reduce influence of multi-reflection in a resist film, thereby suppressing standing wave.

Also, a photosensitizer may be added to the resist composition for improving acid-generating efficiency with the exposure. Preferred examples of the photosensitizer include benzophenone, p,p'-tetramethyldiaminobenzophenone, 2-chlorothioxanthone, anthrone, 9-ethoxyanthracene, pyrene, phenothiazine, benzyl, benzoflavin, acetophenone, phenanthrene, benzoquinone, anthraquinone and 1,2-naphthoquinone, but the invention should not be construed as being limited thereto. The photosensitizer may also be used as the antihalation agent.

<<Method for Use>>

The positive resist composition of the invention is used by dissolving the components in a solvent, filtering the solution through a filter and applying the solution onto a desired substrate in the following manner.

Specifically, the positive resist composition is applied to a substrate (e.g., silicon/silicon dioxide coating) as used for the production of a precise integrated circuit device by appropriate application means, for example, a spinner or coater, and heated to form a resist film.

Then, the resulting resist film is exposed to light through a desired mask, followed by heating and development. Thus, good resist patterns are obtained. As the light for exposure, a far ultraviolet ray having preferably a wavelength of 250 nm or shorter, more preferably 220 nm or shorter is used. Specific examples thereof include actinic ray, for example, KrF excimer laser (248 nm), ArF excimer laser (193 nm) or $F_2$ excimer laser (157 nm) and radiation, for example, X-ray or electron beam.

As the alkali developing solution for the positive resist composition of the invention, an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine can be used.

A developing solution prepared by adding an appropriate amount of an alcohol or a surfactant to the aqueous alkaline solution may also be used.

The alkali concentration of the alkali developing solution is ordinarily from 0.1 to 20% by weight. The pH of the alkali developing solution is ordinarily from 10.0 to 14.0.

The present invention will be described in more detail with reference to the following examples, but the invention should not be construed as being limited thereto.

SYNTHESIS EXAMPLE 1

Synthesis of Resin (1)

2-Ethyl-2-adamantyl methacrylate and butyrolactone methacrylate were charged in a molar ratio of 55/45 and dissolved in a mixed solvent of methyl ethyl ketone and tetrahydrofuran (5/5 by weight) to prepare 100 ml of a solution having a solid concentration of 20% by weight. To the solution was added 2% by mole of a polymerization initiator (V-65 manufactured by Wako Pure Chemical Industries, Ltd.), and the solution was added dropwise to 10 ml of methyl ethyl ketone heated at 60° C. under nitrogen gas atmosphere over a period of 4 hours. After the completion of the dropwise addition, the reaction solution was heated for 4 hours and 1% by mole of V-65 was again added thereto, followed by stirring for 4 hours. After the completion of the reaction, the reaction solution was cooled to room temperature and poured into 3 liters of a mixed solvent of distilled water and isopropyl alcohol (1/1 by weight) to crystallize, and the white powder deposited was recovered to obtain Resin (1).

A monomer unit composition ratio of the resin determined by $C^{13}NMR$ was 46/54. The weight average molecular weight thereof measured by GPC and calculated in terms of standard polystyrene was 10,700.

Resins (2) to (12) were synthesized in a similar manner to Synthesis Example 1, respectively.

The monomer unit composition ratio and weight average molecular weight of each of Resins (2) to (10) are shown below. Repeating Units 1, 2, 3 and 4 denote the repeating units of Resins (2) to (10) shown below in order from left to right, respectively.

TABLE 1

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 2 | 42 | 31 | 27 | — | 8,300 |
| 3 | 42 | 30 | 28 | — | 10,300 |
| 4 | 39 | 35 | 26 | — | 8,900 |
| 5 | 46 | 22 | 30 | 2 | 12,900 |
| 6 | 38 | 32 | 30 | — | 11,300 |
| 7 | 50 | 20 | 20 | 10 | 11,500 |
| 8 | 40 | 40 | 20 | — | 12,300 |
| 9 | 40 | 40 | 20 | — | 11,300 |
| 10 | 30 | 30 | 10 | 30 | 11,500 |

Structures of Resins (1) to (10) are shown below.

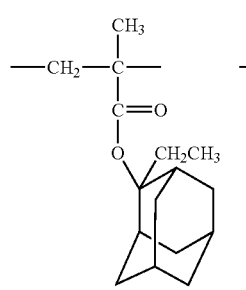
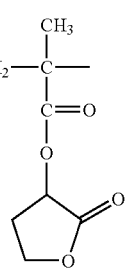
(1)

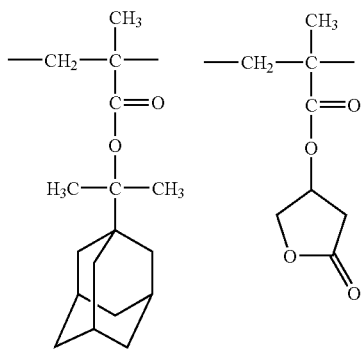
(2)

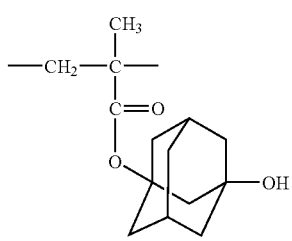

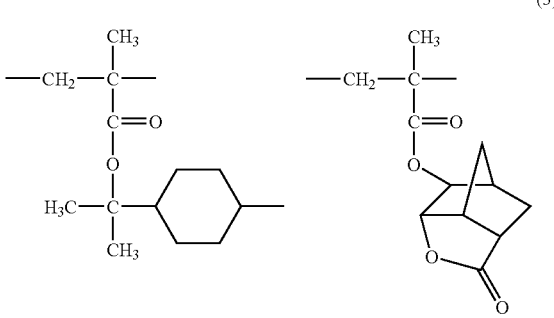
(3)

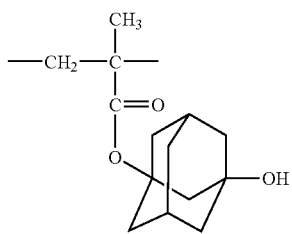

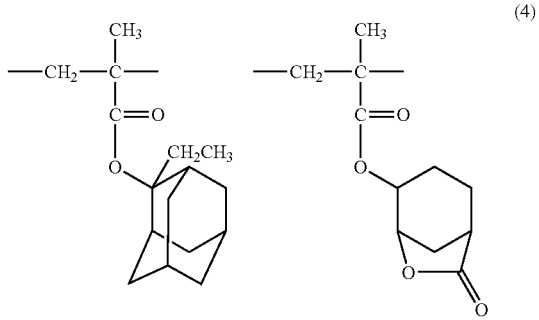
(4)

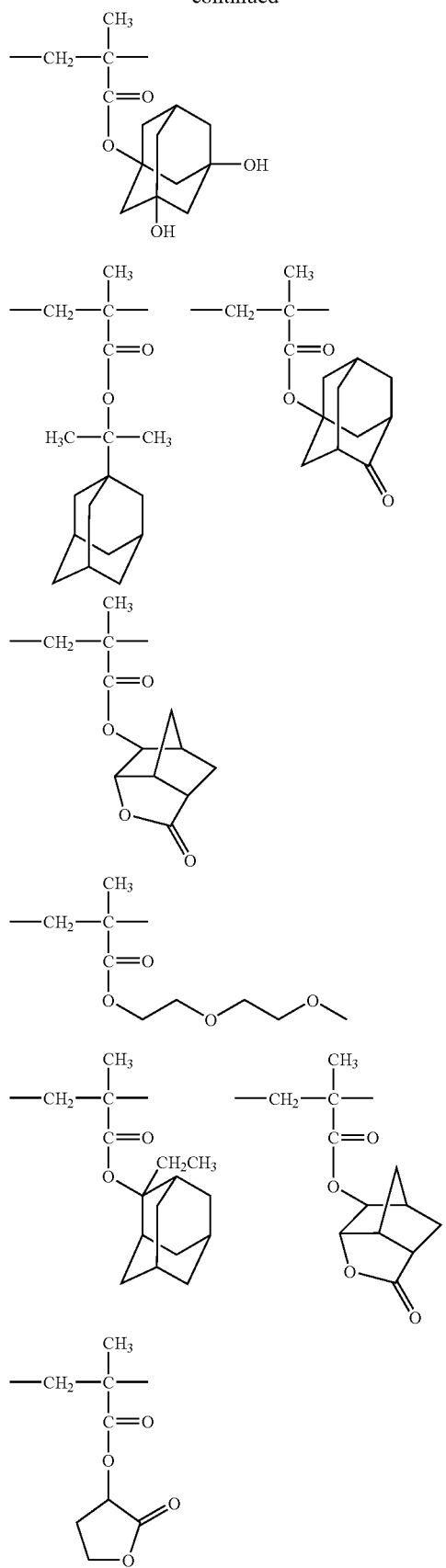
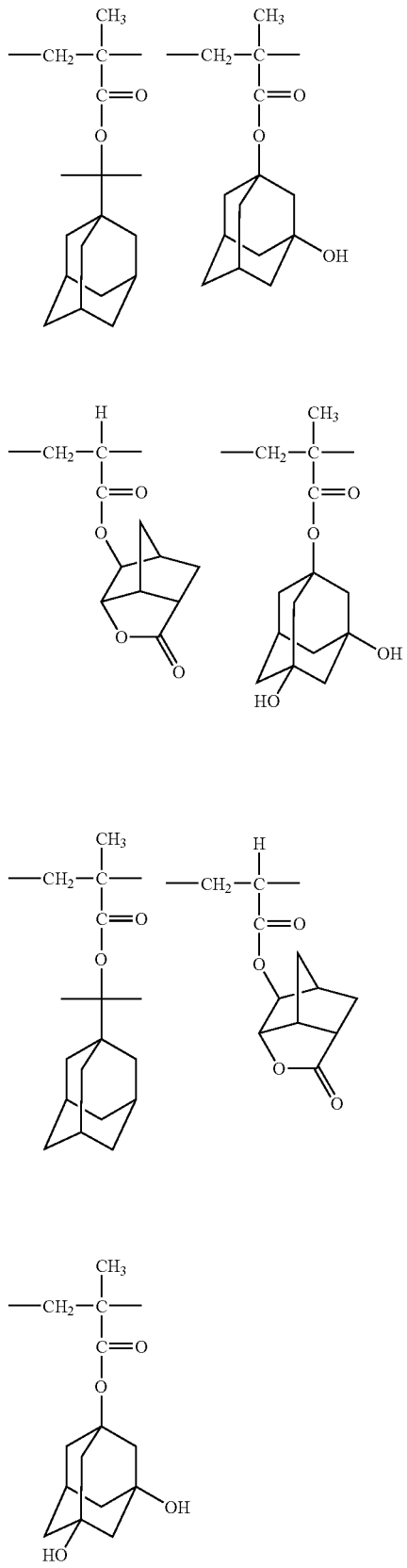

-continued

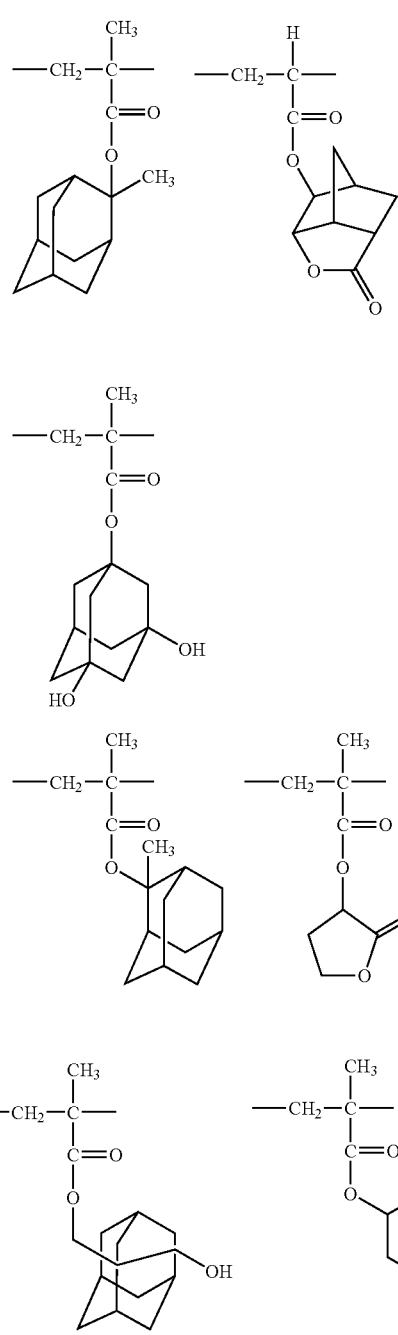

The monomer unit composition ratio and weight average molecular weight of each of Resins (11) to (12) are shown below.

Structures of Resins (11) and (12) are shown below.

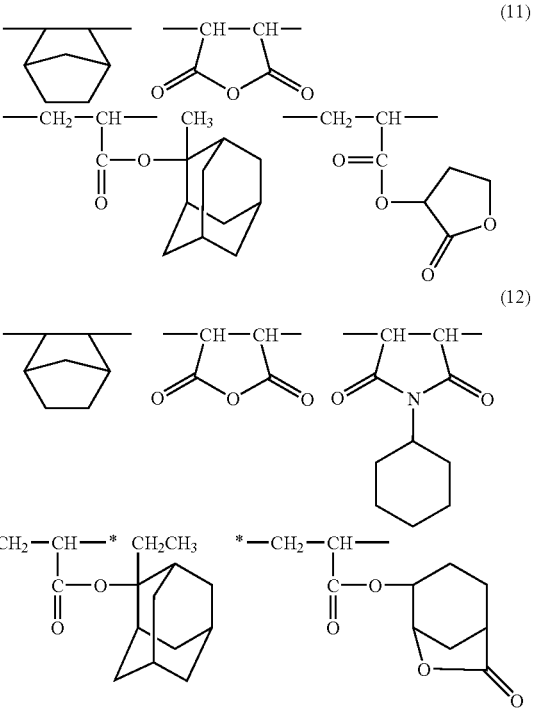

TABLE 2

| Resin | Norbornene (mol %) | Acid Anhydride (mol %) | (Meth)acrylate (mol %) | Weight Average Molecular Weight |
|---|---|---|---|---|
| 11 | 16 | 21 | 36/27 | 13,900 |
| 12 | 18 | 17/3 | 30/32 | 13,300 |

SYNTHESIS EXAMPLE 2

Synthesis of Compound ((I)-1)

To a tetrahydrofuran solution of a Grignard reagent prepared from 28.1 g (0.075 mol) of 4-nonafluorobutylbromobenzene in a conventional manner was added 6.1 g (0.028 mol) of diphenylsulfoxide and then was dropwise added 8.1 g (0.075 mol) of trimethylsilyl chloride at 0 to 30° C., followed by stirring for 3 hours. After the completion of the reaction, the resulting reaction solution was poured into 100 ml of a 12% hydrobromic acid solution, and the mixture was washed with 75 ml of toluene and extracted three times with each 75 ml of dichloromethane. The desired product obtained was concentrated to solid and crystallized by adding 100 ml of ethyl acetate to obtain 7.5 g of 4-nonafluorobutylphenyldiphenylsulfonium bromide.

In 50 ml of methanol was dissolved 5.6 g (0.01 mol) of the thus-obtained 4-nonafluorobutylphenyldiphenylsulfonium bromide, and to the solution was added 2.3 g (0.01 mol) of silver oxide, followed by stirring at room temperature for 2 hours. The resulting silver salt was filtered and 3.0 g (0.01 mol) of nonafluorobutanesulfonic acid was added thereto, followed by stirring at room temperature for one hour. The crude product obtained was concentrated to solid and crystallized by adding 100 ml of normal hexane to obtain 7.60 g of Compound ((I)-1).

Other compounds of formula (I) are obtained according to synthesis methods similar to Synthesis Example 2.

SYNTHESIS EXAMPLE 3

Synthesis of Compound (PAG-A)

To a tetrahydrofuran solution of a Grignard reagent prepared from 13.1 g (0.075 mol) of 4-bromofluorobenzene in a conventional manner was added 7.2 g (0.028 mol) of bis-4-fluorophenylsulfoxide and then was dropwise added 8.1 g (0.075 mol) of trimethylsilyl chloride at 20 to 25° C., followed by stirring for 3 hours. After the completion of the reaction, the resulting reaction solution was poured into 100 ml of a 12% hydrobromic acid solution, and the mixture was washed with 75 ml of toluene and extracted three times with each 75 ml of dichloromethane. The desired product obtained was concentrated to solid and crystallized by adding 30 ml of acetone to obtain 6.5 g of tris(4-fluorophenyl)sulfonium bromide.

EXAMPLES 1 TO 10 AND COMPARATIVE EXAMPLES 1 TO 5

(Preparation and Evaluation of Positive Resist Composition)

As shown in Table 3 below, 1.03 g of resin, 0.00035 mol of photo-acid generator, 1.65 mg of nitrogen-containing basic compound and 100 ppm of surfactant to the whole components were dissolved in a solvent shown in Table 3 below so as to have solid concentration of 11% by weight, and the resulting solution was filtered through a microfilter having a pore size of 0.1 μm to prepare a positive resist composition for each of Examples 1 to 10 and Comparative Examples 1 to 5.

TABLE 3

| | Resin | Photo-Acid Generator (molar ratio) | Nitrogen-Containing Basic Compound | Surfactant | Solvent (weight ratio) | PED Stability (nm) | Line Edge Roughness (nm) | Profile | Sensitivity | Resolution |
|---|---|---|---|---|---|---|---|---|---|---|
| Example 1 | (4) | (I)-1/(II)-1 (4/1) | N-1 | W-1 | S-1/S-5 (3/2) | 1.6 | 6.6 | A | 35.0 | 0.095 |
| Example 2 | (8) | (I)-2/(II)-2 (2/3) | N-2 | W-1 | S-1/S-5 (3/2) | 1.6 | 6.8 | A | 37.0 | 0.095 |
| Example 3 | (9) | (I)-4 | N-3 | W-1 | S-1/S-10 (3/2) | 2.1 | 6.9 | A | 30.5 | 0.100 |
| Example 4 | (10) | (I)-7 | N-4 | W-1 | S-1/S-5/S-2 (3/1/3) | 2.6 | 7.6 | A | 35.0 | 0.100 |
| Example 5 | (11) | (I)-10 | N-5 | W-1 | S-1/S-5 (3/2) | 2.6 | 7.4 | A | 35.5 | 0.100 |
| Example 6 | (8) | (I)-12 | N-6 | W-2 | S-5 | 1.8 | 6.8 | A | 36.0 | 0.100 |
| Example 7 | (9) | (I)-13 | N-7 | W-2 | S-1/S-10 (2/3) | 2.9 | 6.9 | A | 38.5 | 0.100 |
| Example 8 | (12) | (I)-16 | N-5 | W-1 | S-1/S-2 (2/3) | 3.3 | 7.6 | A | 36.5 | 0.100 |
| Example 9 | (2) | (I)-20 | — | — | S-1/S-7 (20/1) | 4.9 | 6.9 | A | 25.0 | 0.100 |
| Example 10 | (10) | (I)-22 | N-7 | W-2 | S-1/S-9 (20/1) | 2.6 | 7.6 | A | 37.5 | 0.100 |
| Comparative Example 1 | (12) | (II)-1 | N-5 | W-1 | S-1 | 10.5 | 11.5 | C | 34.5 | 0.115 |
| Comparative Example 2 | (11) | (II)-1 | N-5 | W-1 | S-1/S-7 (20/1) | 11.5 | 10.2 | C | 36.5 | 0.115 |
| Comparative Example 3 | (12) | (II)-1 | — | W-1 | S-1/S-7 (20/1) | 11.0 | 10.3 | C | 24.0 | 0.115 |
| Comparative Example 4 | (10) | PAG-A/PAG5-3 (1/3) | N-1 | W-1 | S-1 | 12.0 | 9.8 | C | 39.0 | 0.150 |
| Comparative Example 5 | (10) | PAG-B | N-1 | W-1 | S-1 | 13.0 | 10.8 | B | 36.0 | 0.150 |

In 50 ml of methanol was dissolved 4.0 g (0.01 mol) of the thus-obtained tris(4-fluorophenyl)sulfonium bromide, and to the solution was added 2.3 g (0.01 mol) of silver oxide, followed by stirring at room temperature for 2 hours. The resulting silver salt was filtered and 3.0 g (0.01 mmol) of nonafluorobutanesulfonic acid was added thereto, followed by stirring at room temperature for one hour. The crude product obtained was concentrated to solid and crystallized by adding 100 ml of normal hexane to obtain 5.5 g of Compound (PAG-A).

SYNTHESIS EXAMPLE 4

Synthesis of Compound (PAG-B)

In 50 ml of dichloromethane were dissolved 7.2 g (0.03 mol) of di(4-fluorophenyl)sulfoxide and 5.8 g (0.06 mol) of fluorobenzene, and to the solution was dropwise added 8.9 g (0.315 mol) of trifluoromethanesulfonic anhydride at −78 to −80° C. The temperature of the reaction solution was gradually raised to room temperature, followed by subjecting to reaction with stirring for 2 hours. The reaction solution was washed with water and concentrated, and the resulting crude product was crystallized with a mixed solvent of ethyl acetate/n-hexane (3:1) to obtain 8.8 g of Compound (PAG-B).

The photo-acid generators shown in Table 3 are the following compounds.

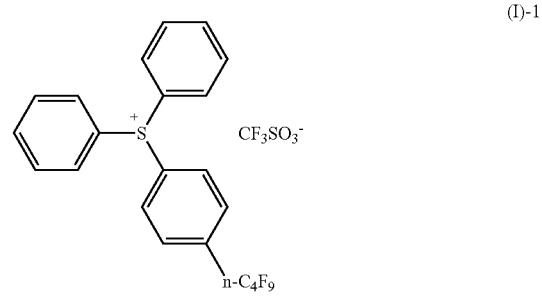

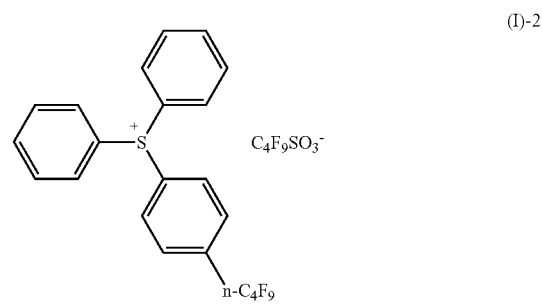

-continued
(I)-4
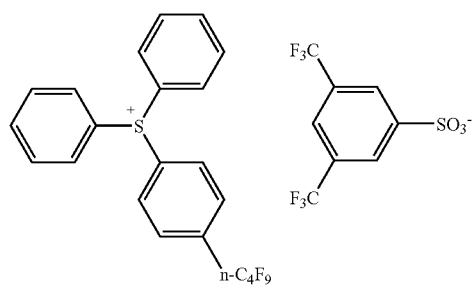
(I)-7
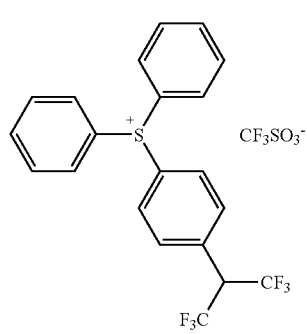
(I)-10
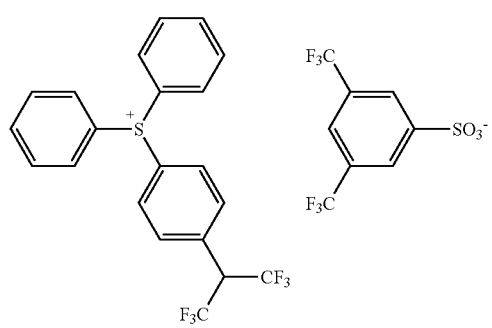
(I)-12
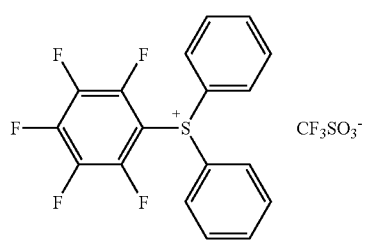
(I)-13
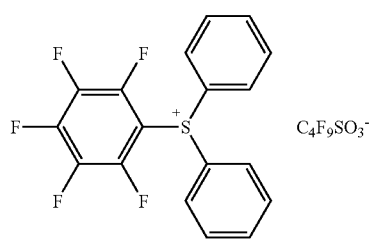
-continued
(I)-16
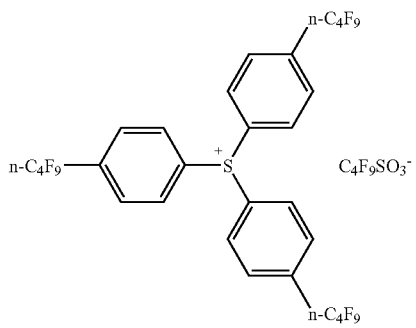
(I)-20
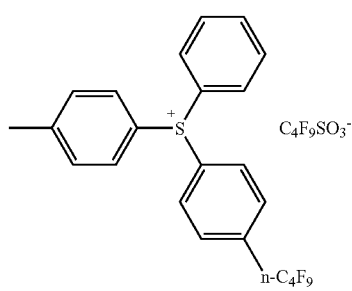
(I)-22
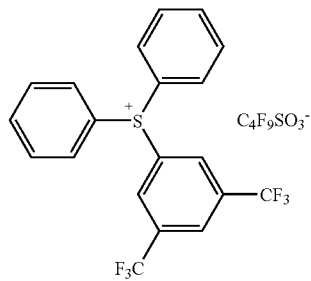
II-1
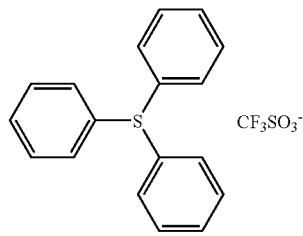
II-2
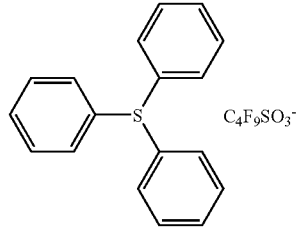

-continued

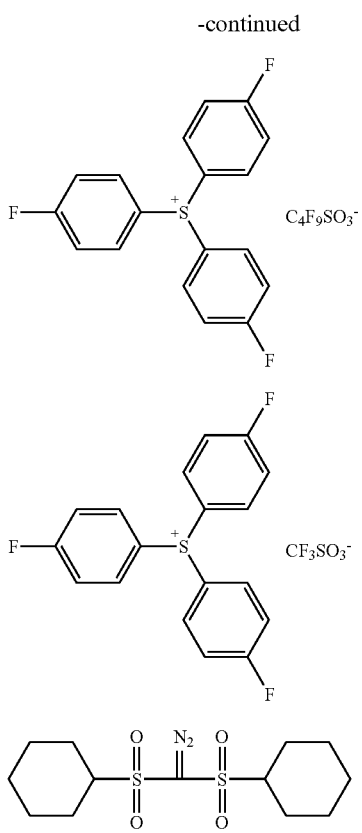

The nitrogen-containing basic compounds shown in Table 3 are the following compounds.
N-1: 1,5-Diazabicyclo[4.3.0]-5-nonene
N-2: 1,8-Diazabicyclo[5.4.0]-7-undecene
N-3: 4-Dimethylaminopyridine
N-4: Triphenylimidazole
N-5: Diisopropylamine
N-6: Tributylamine
N-7; Trioctylamine The surfactants shown in Table 3 are the following compounds.
W-1: Megafac F176 (manufactured by Dainippon Ink and Chemicals, Inc.) (fluorine-based)
W-2: Megafac R08 (manufactured by Dainippon Ink and Chemicals, Inc.) (fluorine- and silicon-based)

The solvents shown in Table 3 are the following compounds.
S-1: Propylene glycol monomethyl ether acetate
S-2: Ethyl lactate
S-3: Butyl acetate
S-4: 2-Heptanone
S-5: Propylene glycol monomethyl ether
S-6: Ethyl ethoxypropionate
S-7: γ-Butyrolactone
S-8; Ethylene carbonate
S-9: Propylene carbonate
S-10: Cyclohexanone <Evaluations of Line Edge Roughness, Sensitivity and Resolution>

On a silicon wafer, which had been subjected to hexamethyldisilazan treatment, was uniformly coated ARC29a (manufactured by Brewer Science, Inc.) at thickness of 780 angstroms by a spin coater and dried at 100° C. for 90 seconds on a hot plate then dried by heating at 205° C. for 60 seconds to prepare an anti-reflective coating. Then, the positive resist composition just after the preparation was coated on the anti-reflective coating by a spin coater and heated at 120° C. for 90 seconds to form a positive resist film having a thickness of 0.30 μm.

The resist film was exposed through a mask using an ArF excimer laser stepper (manufactured by ISI Co., ltd.; NA=0.6) and immediately after the exposure, it was heated at 120° C. for 90 seconds on a hot plate. Then, the resist film was developed with a 2.38% by weight aqueous solution of tetramethylammonium hydroxide at 23° C. for 60 seconds, rinsed with pure water for 30 seconds and dried to obtain a resist line pattern.

With respect to the measurement of line edge roughness, line edge roughness of isolated pattern was measured using a critical dimension scanning electron microscope. Specifically, a distance from the standard line where the edge should be present to the edge of the line pattern was measured in 50 points in the area of a length of 5 μm in the longitudinal direction of the line pattern using a critical dimension scanning electron microscope (s-8840 manufactured by Hitachi, Ltd.), standard deviation was determined, and 3σ was calculated. The smaller the value, the better the quality.

The sensitivity was indicated by an exposure amount (mJ/cm$^2$) necessary for reproducing a line and space (1/1) pattern of 0.15 μm.

The resolution was expressed by a minimum dimension (μm) of a resist pattern capable of being resolved when exposed in the above-described exposure amount.

<Evaluation of Profile>

A cross-section shape of a line pattern of 0.15 μm obtained by the minimum exposure amount necessary for reproducing a line pattern of 0.15 μm in a mask was observed using a critical dimension scanning electron microscope. A rectangular shape was ranked as "A", a round-topped shape as "C" and a somewhat round-topped shape as "B".

<Evaluation of PED Stability>

A resist film formed by coating and heating the positive resist composition was irradiated in an irradiation amount sufficient to form a line and space pattern of 0.15 μm as designed (for example, ArF excimer laser: 30 mJ/cm$^2$) and the irradiated wafer was allowed to stand for one hour in a clean room. Subsequently, the wafer was heated and developed in the same manner as described above to obtain a line and space pattern. Deviation from the designed dimension of the line and space pattern of 0.15 μm was measured.

(Designed Dimension)−(Actual Dimension)(nm)

The smaller the value, the better the quality.

The results of the evaluation are shown in Table 3.

It can be seen from Table 3 that the positive resist composition of the invention exhibits favorable line edge roughness, high sensitivity, high resolution and rectangular profile and is excellent in FED stability.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising (A) a resin that increases solubility in an alkali developing solution by the action of an acid and includes a monocyclic or polycyclic alicyclic hydrocarbon structure, and includes a structure represented by the following formula (H):

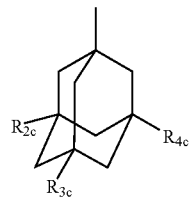

(H)

wherein $R_{2c}$ to $R_{4c}$ each independently represents a hydrogen atom or a hydroxy group, provided that at least one of $R_{2c}$ to $R_{4c}$ represents a hydroxy group; and (B-1) a compound represented by the following formula (I):

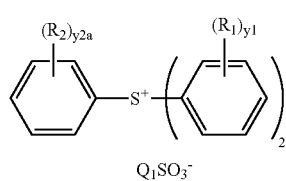

(I)

wherein $R_1$ represents an alkyl group, an alicyclic hydrocarbon group, a hydroxy group, a carboxy group, an alkoxy group, a halogen atom or a phenylthio group, which may be the same or different, when two or more $R_1$'s are present; $R_2$ represents an alkyl group, an alicyclic hydrocarbon group, a hydroxy group, a carboxy group, an alkoxy group, a halogen atom or a phenylthio group, which may be the same or different, when two or more $R_2$'s are present, provided that at least one of $R_2$ represents a fluorine atom, an alkyl group substituted with a fluorine atom, an alicyclic hydrocarbon group substituted with a fluorine atom, an alkoxy group substituted with a fluorine atom or a phenylthio group substituted with a fluorine atom; $y_1$ each independently represents an integer of from 0 to 5; $y_{2a}$ represents an integer of from 1 to 5, provided that the total number of fluorine atoms included in $(R_2)_{y2a}$ is 4 or more; and $Q_1$ represents an alkyl group substituted with a fluorine atom, a cycloalkyl group substituted with a fluorine atom, an aryl group substituted with a fluorine atom or an aryl group substituted with a fluorinated alkyl group.

2. The positive resist composition as claimed in claim 1, which further comprises a compound represented by following formula (II) or (III):

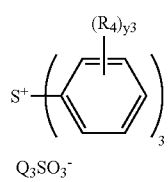

(II)

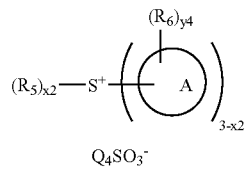

(III)

wherein $R_4$ represents an alkyl group, an alicyclic hydrocarbon group, a hydroxy group, a carboxy group or an alkoxy group, which may be the same or different, when two or more $R_4$'s are present; $R_5$ represents an alkyl group, an alicyclic hydrocarbon group, which may be the same or different, when two or more $R_5$'s are present, or when two or more $R_5$'s are present, two of $R_5$'s may be combined with each other to form a ring; $R_6$ represents an alkyl group, an alicyclic hydrocarbon group, a hydroxy group, a carboxy group or an alkoxy group, which may be the same or different, when two or more $R_6$'s are present; A represents an aromatic group; $X_2$ represents an integer of from 1 to 3; $y_3$ each independently represents an integer of from 0 to 5; $y_4$ each independently represents an integer of from 0 to 5; and $Q_3$ and $Q_4$ each represents an alkyl group substituted with a fluorine atom, a cycloalkyl group substituted with a fluorine atom, an aryl group substituted with a fluorine atom or an aryl group substituted with a fluorinated alkyl group.

3. The positive composition as claimed in claim 1, which further comprises (D) a nitrogen-containing basic compound.

4. The positive resist composition as claimed in claim 1, wherein the resin of component (A) is a resin containing an alkali-soluble group protected with a 2-alkyl-2-adamantyl group or a 1-adamantyl-1-alkylalkyl group.

5. A pattern formation method comprising the steps of forming a resist film using the positive resist composition as claimed in claim 1, exposing the resist film, and developing the exposed resist film.

6. The positive resist composition as claimed in claim 1, wherein in —(Ph—(R$_1$)y$_1$)2, the total number of fluorine atoms directly substituted to any one benzene ring is 4 or less.

7. A positive resist composition comprising:
(A) a resin that increases solubility in an alkali developing solution by the action of an acid and includes a monocyclic or polycyclic alicyclic hydrocarbon structure which is dihydroxyadamantane, and
(B-1) a compound represented by the following formula (I):

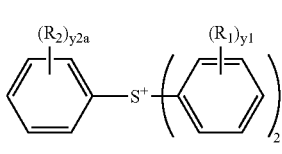

(I)

wherein $R_1$ represents an alkyl group, an alicyclic hydrocarbon group, a hydroxy group, a carboxy group, an alkoxy group, a halogen atom or a phenylthio group, which may be the same or different, when two or more $R_1$'s are present; $R_2$ represents an alkyl group, an alicyclic hydrocarbon group, a hydroxy group, a carboxy group, an alkoxy group, a halogen atom or a phenylthio group, which may be the same or different, when two or more $R_2$'s are present, provided that at least one of $R_2$ represents a fluorine atom, an alkyl group substituted with a fluorine atom, an alicyclic hydrocarbon group substituted with a fluorine atom, an alkoxy group substituted with a fluorine atom or a phenylthio group substituted with a fluorine atom; $y_1$ each independently represents an integer of from 0 to 5; $y_{2a}$ represents an integer of from 1 to 5, provided that the total number of fluorine atoms included in $(R_2)_{y2a}$ is 4 or more; and $Q_1$ represents an alkyl group substituted with a fluorine atom, a cycloalkyl group substituted with a fluorine atom, an aryl group substituted with a fluorine atom or an aryl group substituted with a fluorinated alkyl group.

\* \* \* \* \*